US011803119B2

(12) United States Patent
Pawlowski et al.

(10) Patent No.: US 11,803,119 B2
(45) Date of Patent: Oct. 31, 2023

(54) CONTAMINANT DETECTION METROLOGY SYSTEM, LITHOGRAPHIC APPARATUS, AND METHODS THEREOF

(71) Applicants: ASML Holding N.V., Veldhoven (NL); ASML Netherlands B.V., Veldhoven (NL)

(72) Inventors: Michal Emanuel Pawlowski, Norwalk, CT (US); Aage Bendiksen, Fairfield, CT (US); Ryan Alan Munden, Trumbull, CT (US); Han-Kwang Nienhuys, Utrecht (NL)

(73) Assignees: ASML Holding N.V., Veldhoven (NL); ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/790,339

(22) PCT Filed: Dec. 8, 2020

(86) PCT No.: PCT/EP2020/085105
§ 371 (c)(1),
(2) Date: Jun. 30, 2022

(87) PCT Pub. No.: WO2021/136631
PCT Pub. Date: Jul. 8, 2021

(65) Prior Publication Data
US 2023/0106481 A1    Apr. 6, 2023

Related U.S. Application Data

(60) Provisional application No. 63/115,809, filed on Nov. 19, 2020, provisional application No. 62/955,883, filed on Dec. 31, 2019.

(51) Int. Cl.
  *G03F 1/84*    (2012.01)
  *G03F 7/00*    (2006.01)
  *G01N 21/94*   (2006.01)

(52) U.S. Cl.
  CPC .............. *G03F 1/84* (2013.01); *G03F 7/7085* (2013.01); *G03F 7/70191* (2013.01); *G03F 7/70916* (2013.01); *G01N 21/94* (2013.01)

(58) Field of Classification Search
  CPC ...... G03F 1/84; G03F 7/70191; G03F 7/7085; G03F 7/70916; G01N 21/94
  See application file for complete search history.

(56) References Cited

U.S. PATENT DOCUMENTS

| | | |
|---|---|---|
| 4,588,293 A | 5/1986 | Axelrod |
| 5,343,290 A | 8/1994 | Batchelder et al. |

(Continued)

FOREIGN PATENT DOCUMENTS

| | | |
|---|---|---|
| JP | S60-144648 A | 7/1985 |
| JP | H06-027028 A | 2/1994 |

(Continued)

OTHER PUBLICATIONS

International Search Report and Written Opinion of the International Searching Authority directed to related International Patent Application No. PCT/EP2020/085105, dated Mar. 17, 2021; 12 pages.

(Continued)

*Primary Examiner* — Hung V Nguyen
(74) *Attorney, Agent, or Firm* — Sterne, Kessler, Goldstein & Fox P.L.L.C.

(57) ABSTRACT

A system (400) includes an illumination system (402), a detector (404), and a comparator (406). The illumination system includes a radiation source (408) and a spatial light modulator (410). The radiation source generates a beam of (Continued)

radiation (442). The spatial light modulator directs the beam toward a surface (436) of an object (428) and adjusts a spatial intensity distribution of the beam at the surface. The detector receives radiation (444) scattered at the surface and by a structure (434) near the surface. The detector generates a detection signal based on the received radiation. The comparator receives the detection signal, generates a first image based on the detection signal, and distinguishes between a spurious signal and a signal corresponding to a presence of a foreign particle on the surface based on the first image and the adjusted spatial intensity distribution.

20 Claims, 11 Drawing Sheets

(56) References Cited

U.S. PATENT DOCUMENTS

| | | | |
|---|---|---|---|
| 5,602,639 | A | 2/1997 | Kohno |
| 7,349,082 | B2 | 3/2008 | Onvlee et al. |
| 7,511,799 | B2 | 3/2009 | Tel et al. |
| 7,630,086 | B2 * | 12/2009 | Oak .................. G01B 11/306 |
| | | | 356/600 |
| 10,533,954 | B2 | 1/2020 | Nicolaides et al. |
| 10,739,272 | B2 | 8/2020 | Kurihara et al. |
| 10,983,478 | B2 * | 4/2021 | Cheng ................ G03H 1/0866 |
| 2004/0100629 | A1 | 5/2004 | Stokowski et al. |
| 2008/0304056 | A1 | 12/2008 | Alles et al. |
| 2012/0086800 | A1 * | 4/2012 | Vladimirsky ........ G06V 10/145 |
| | | | 382/141 |
| 2012/0294507 | A1 | 11/2012 | Sakai et al. |
| 2014/0098356 | A1 | 4/2014 | Ryzhikov et al. |
| 2017/0108444 | A1 | 4/2017 | Otani et al. |
| 2018/0202943 | A1 | 7/2018 | Chen et al. |
| 2019/0317413 | A1 | 10/2019 | Cheng et al. |

FOREIGN PATENT DOCUMENTS

| | | |
|---|---|---|
| JP | H06-50903 A | 2/1994 |
| JP | H06-201601 A | 7/1994 |
| JP | H09-33443 A | 2/1997 |
| JP | 2001-196431 A | 7/2001 |
| JP | 2006-126205 A | 5/2006 |
| JP | 2008-020374 A | 1/2008 |
| JP | 2015-200632 A | 11/2015 |
| JP | 2017-511880 A | 4/2017 |

OTHER PUBLICATIONS

Notice of Reasons for Refusal directed to Japanese Patent Application No. 2022- 540330, dated Jul. 11, 2023; 10 pages.

Search Report by Registered Search Organization directed to Japanese Patent Application No. 2022-540330, dated Jun. 28, 2023; 40 pages.

* cited by examiner

CONTAMINANT DETECTION METROLOGY SYSTEM, LITHOGRAPHIC APPARATUS, AND METHODS THEREOF

CROSS-REFERENCE TO RELATED APPLICATIONS

This application claims priority of U.S. Provisional Patent Application No. 62/955,883, which was filed on Dec. 31, 2019, and U.S. Provisional Patent Application No. 63/115,809, which was filed on Nov. 19, 2020, both of which are incorporated herein in their entirety by reference.

FIELD

The present disclosure relates to lithographic systems, for example, inspection systems for detecting contaminants on a reticle in a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, can be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel to this scanning direction. It is also possible to transfer the pattern from the patterning device to the substrate by imprinting the pattern onto the substrate.

Another lithographic system is an interferometric lithographic system where there is no patterning device, but rather a light beam is split into two beams, and the two beams are caused to interfere at a target portion of the substrate through the use of a reflection system. The interference causes lines to be formed at the target portion of the substrate.

During lithographic operation, different processing steps may require different layers to be sequentially formed on the substrate. Sequencing of layers is typically accomplished by exchanging different reticles, according to the desired pattern for each layer, for each pattern transfer process. A typical lithographic system works within sub-nanometer tolerances regarding patterns on the reticle and patterns transferred onto the wafer from the reticle. A contaminant particle on a reticle may introduce errors to transferred patterns. Therefore, it is desirable to maintain contaminant-free reticles capable of accurately transferring patterns onto wafers with sub-nanometer accuracy.

Within the environment of the lithographic apparatus, highly dynamic processes take place, e.g., reticle hand-off, wafer hand-off, controlled gas flows, outgassing of vacuum chamber walls, liquid dispensing (e.g., photoresist coating), temperature variations, metal deposition, rapid movement of numerous actuatable components, and wear of structures. Over time, dynamic processes introduce and build up contaminant particles within the lithographic apparatus.

SUMMARY

There is a need to provide improved inspection techniques to detect contaminants on optically critical components of a lithographic apparatus.

In some embodiments, a system comprises an illumination system, a detector, and a comparator. The illumination system comprises a radiation source and a spatial light modulator. The radiation source is configured to generate a beam of radiation. The spatial light modulator is configured to direct the beam toward a surface of an object and to adjust a spatial intensity distribution of the beam at the surface. The detector is configured to receive radiation scattered at the surface and by a structure near the surface and to generate a detection signal based on the received radiation. The comparator is configured to receive the detection signal, generate a first image based on the detection signal, and distinguish between a spurious signal and a signal corresponding to a presence of a foreign particle on the surface based on the first image and the adjusted spatial intensity distribution.

In some embodiments, a method comprises generating a beam of radiation, adjusting a spatial intensity distribution of the beam using a spatial light modulator, receiving scattered radiation at the detector, wherein the scattered radiation comprises radiation scattered at the surface and radiation scattered by a structure near the surface, generating a detection signal using the detector, receiving the detection signal at a processor, generating a first image based on the detection signal, and distinguishing between a spurious signal and a signal corresponding to a presence of a foreign particle on the surface based on the first image and the adjusted spatial intensity distribution using the processor.

In some embodiments, a lithographic apparatus comprises an illumination apparatus, a projection system, and a metrology system. The metrology system comprises an illumination system, a detector, and a processor. The illumination system comprises a radiation source and a spatial light modulator. The illumination apparatus is configured to illuminate a pattern of a patterning device. The projection system is configured to project an image of the pattern onto a substrate. The radiation source is configured to generate a beam of radiation. The spatial light modulator is configured to direct the beam toward a surface of an object and to adjust a spatial intensity distribution of the beam at the surface. The detector is configured to receive radiation scattered at the surface and by a structure near the surface and to generate a detection signal based on the received radiation. The processor is configured to receive the detection signal, generate a first image based on the detection signal, and distinguish between a spurious signal and a signal corresponding to a presence of a foreign particle on the surface based on the first image and the adjusted spatial intensity distribution.

Further features of the present disclosure, as well as the structure and operation of various embodiments, are described in detail below with reference to the accompanying drawings. It is noted that the present disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present disclosure and, together with the description, further serve to explain the principles of the present disclosure and to enable a person skilled in the relevant art(s) to make and use embodiments described herein.

FIGS. 4, 5A, 5B, and 6 show schematics of metrology systems, according to some embodiments.

Figure 7:
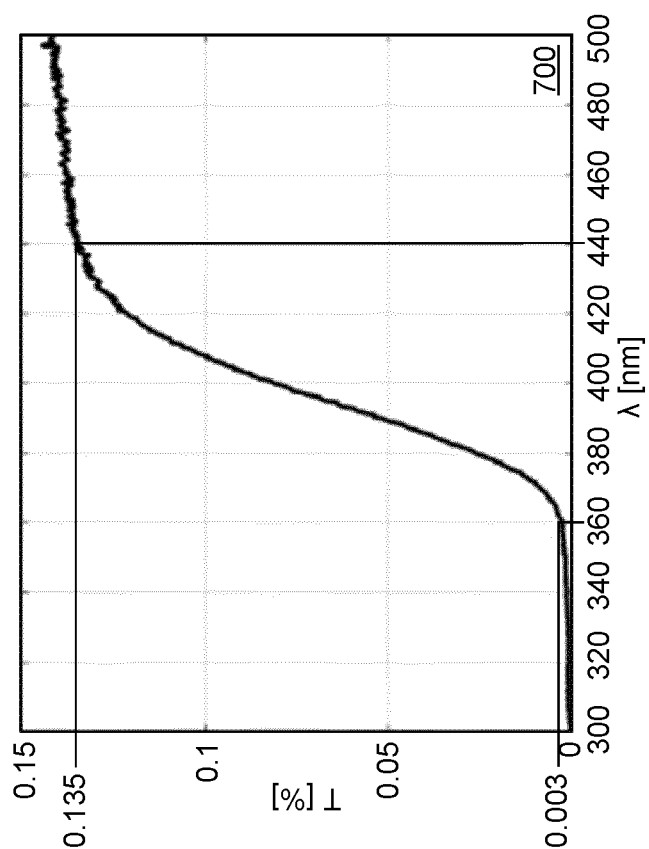

FIG. 7 shows a graph of transmittance of a pellicle versus wavelength of radiation, according to some embodiments.

Figure 8:
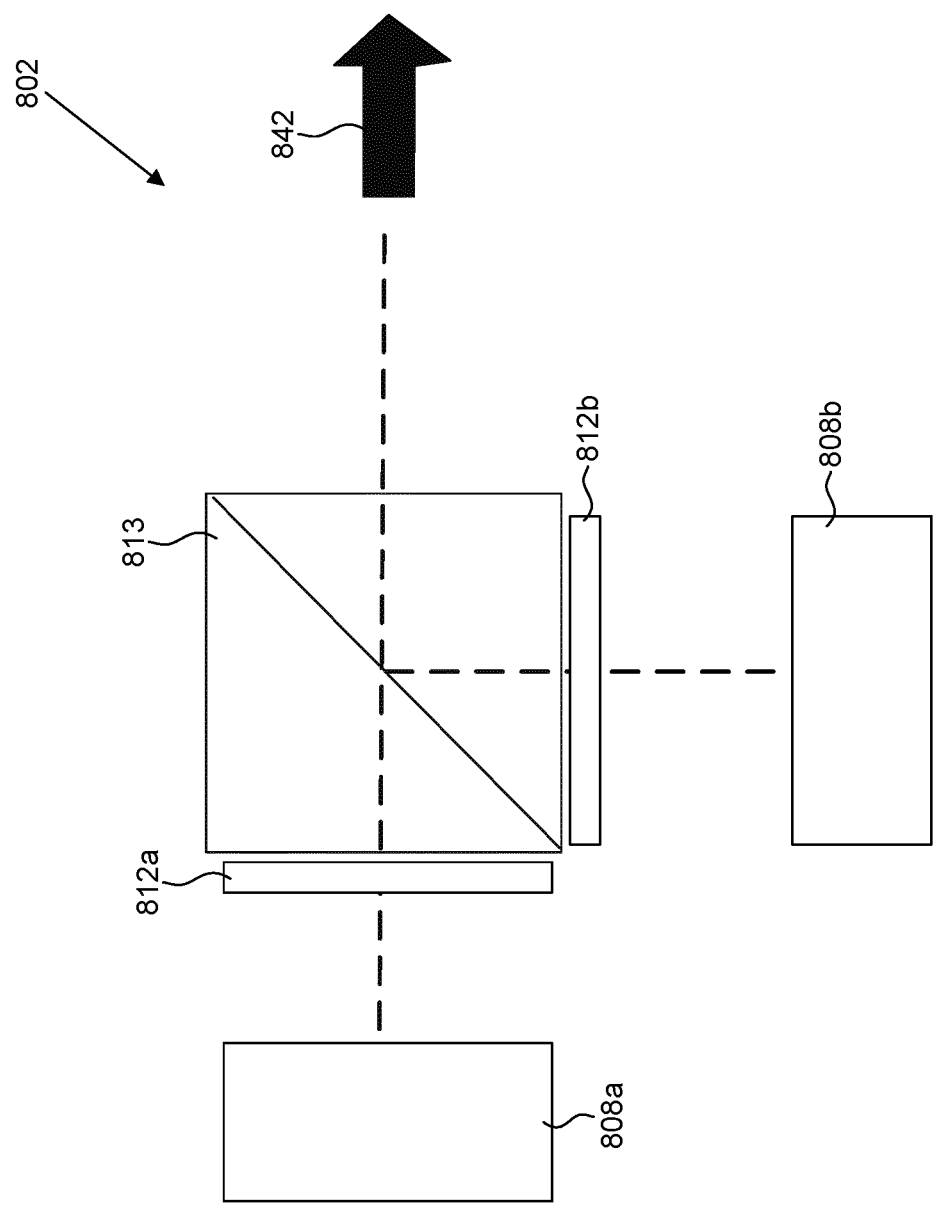

FIG. 8 shows an arrangement of polarizers that may be used in metrology systems, according to some embodiments.

Figure 9:
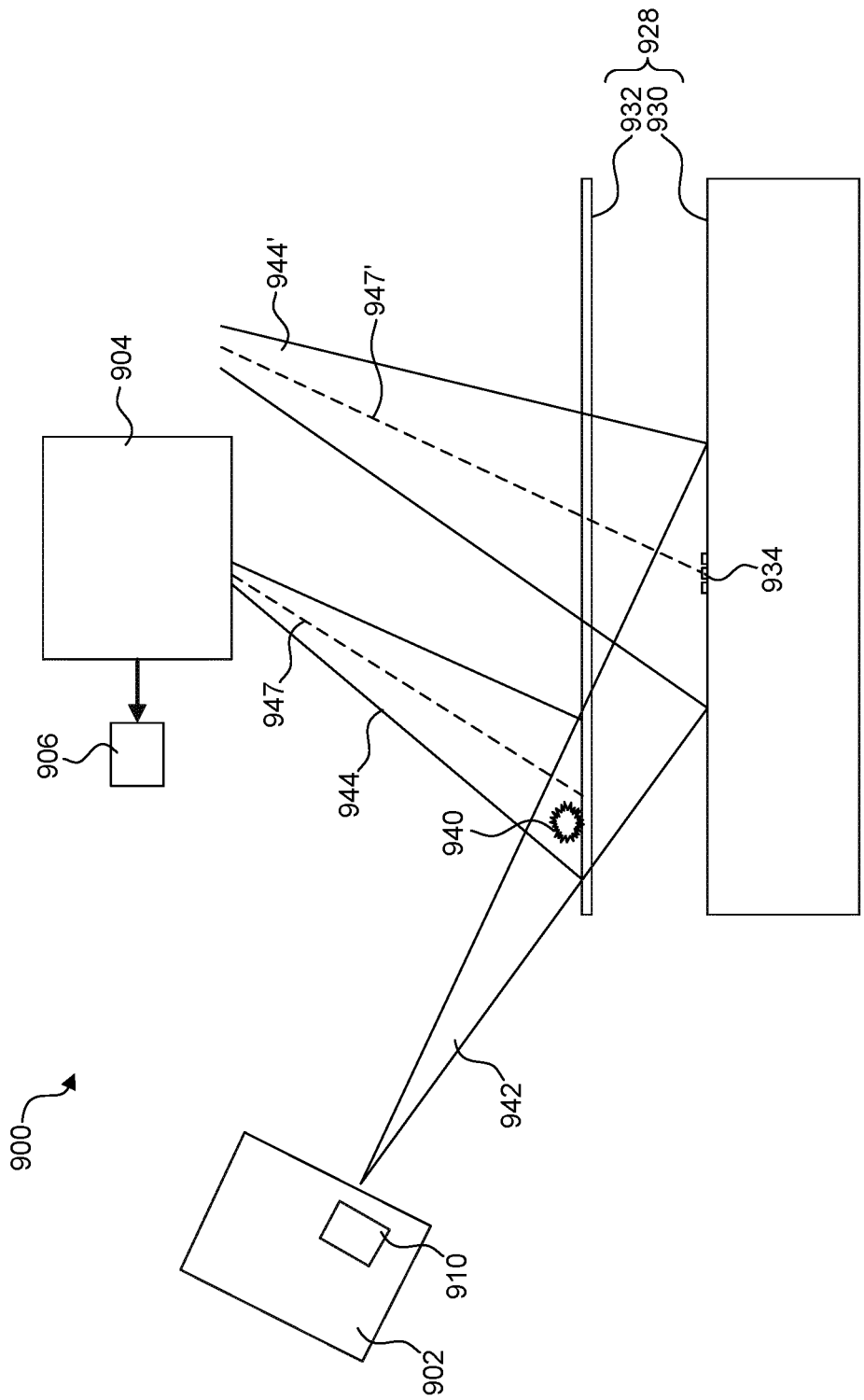

FIG. 9 shows a schematic of a metrology system, according to some embodiments.

Figure 10:
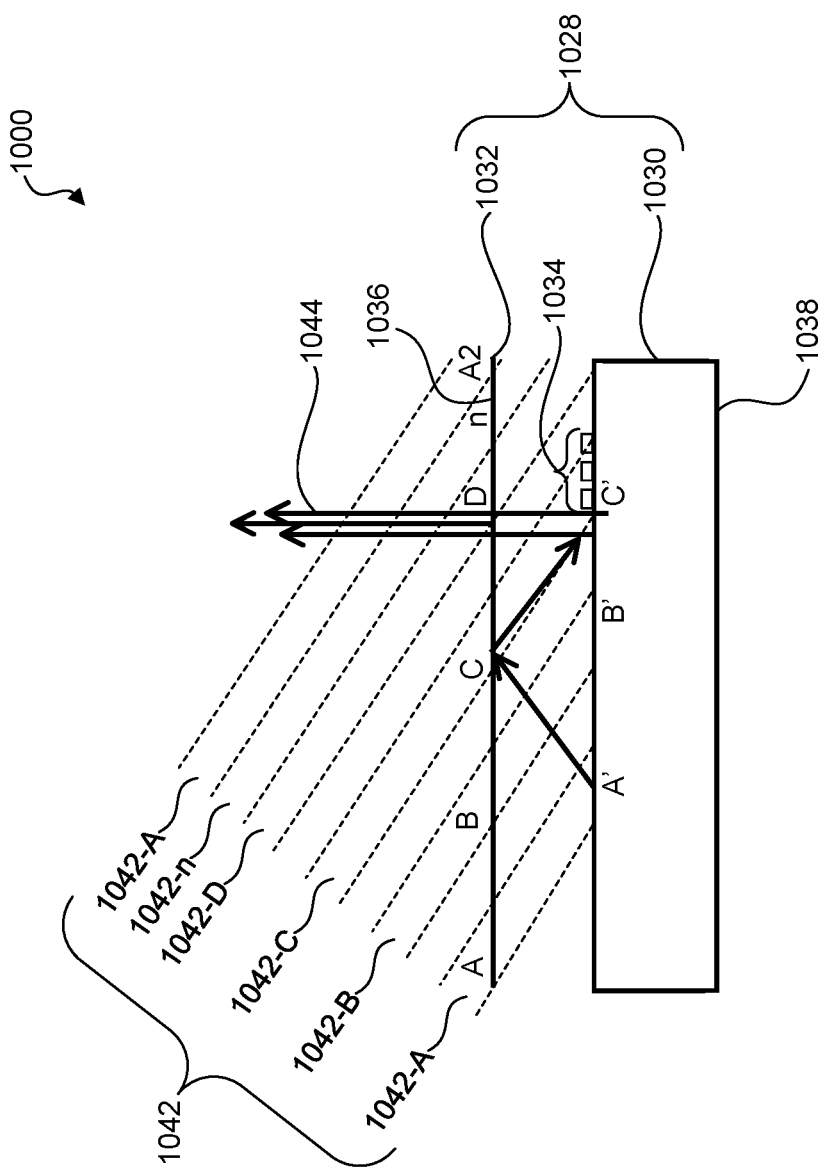

FIG. 10 shows a section of a metrology system, according to some embodiments.

The features of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of the present disclosure. The disclosed embodiment(s) are provided as examples. The scope of the present disclosure is not limited to the disclosed embodiment(s). Claimed features are defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the disclosure can be implemented in hardware, firmware, software, or any combination thereof. Embodiments of the disclosure may also be implemented as instructions stored on a machine-readable medium, which can be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions can be described herein as performing certain actions. However, it should be appreciated that such descriptions are merely for convenience and that such actions in fact result from computing devices, processors, controllers, or other devices executing the firmware, software, routines, instructions, etc. The term "non-transitory" may be used herein to characterize computer readable media used for storing data, information, instructions, and the like, with the sole exception being a transitory, propagating signal.

Before describing such embodiments in more detail, however, it is instructive to present an example environment in which embodiments of the present disclosure can be implemented.

Example Lithographic Systems

Figure 1A:
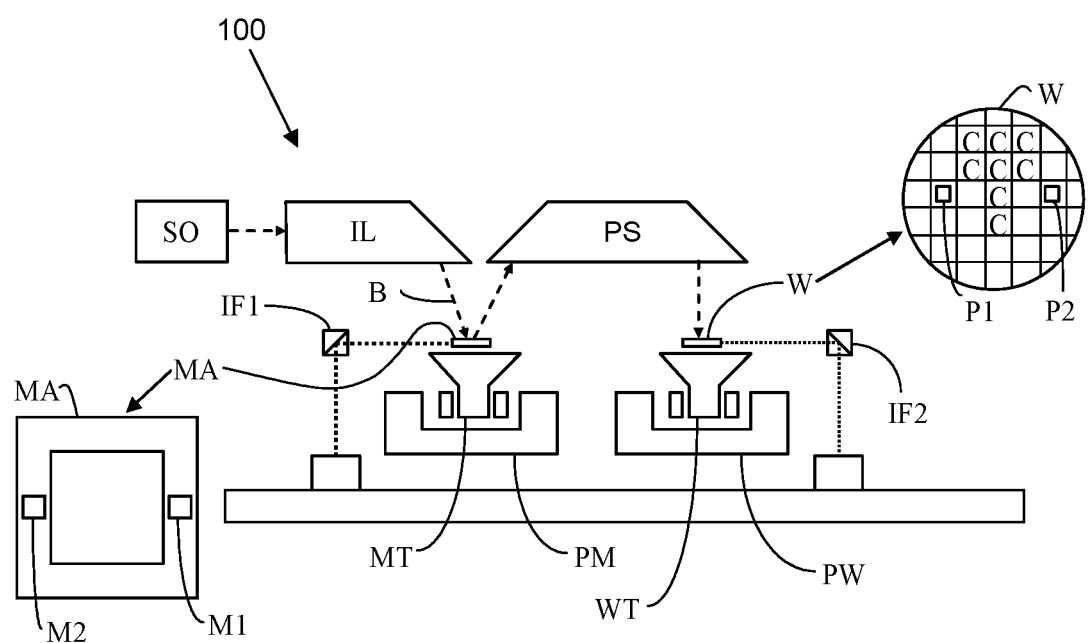
FIG. 1A shows a schematic of a reflective lithographic apparatus, according to some embodiments.
Figure 1B:
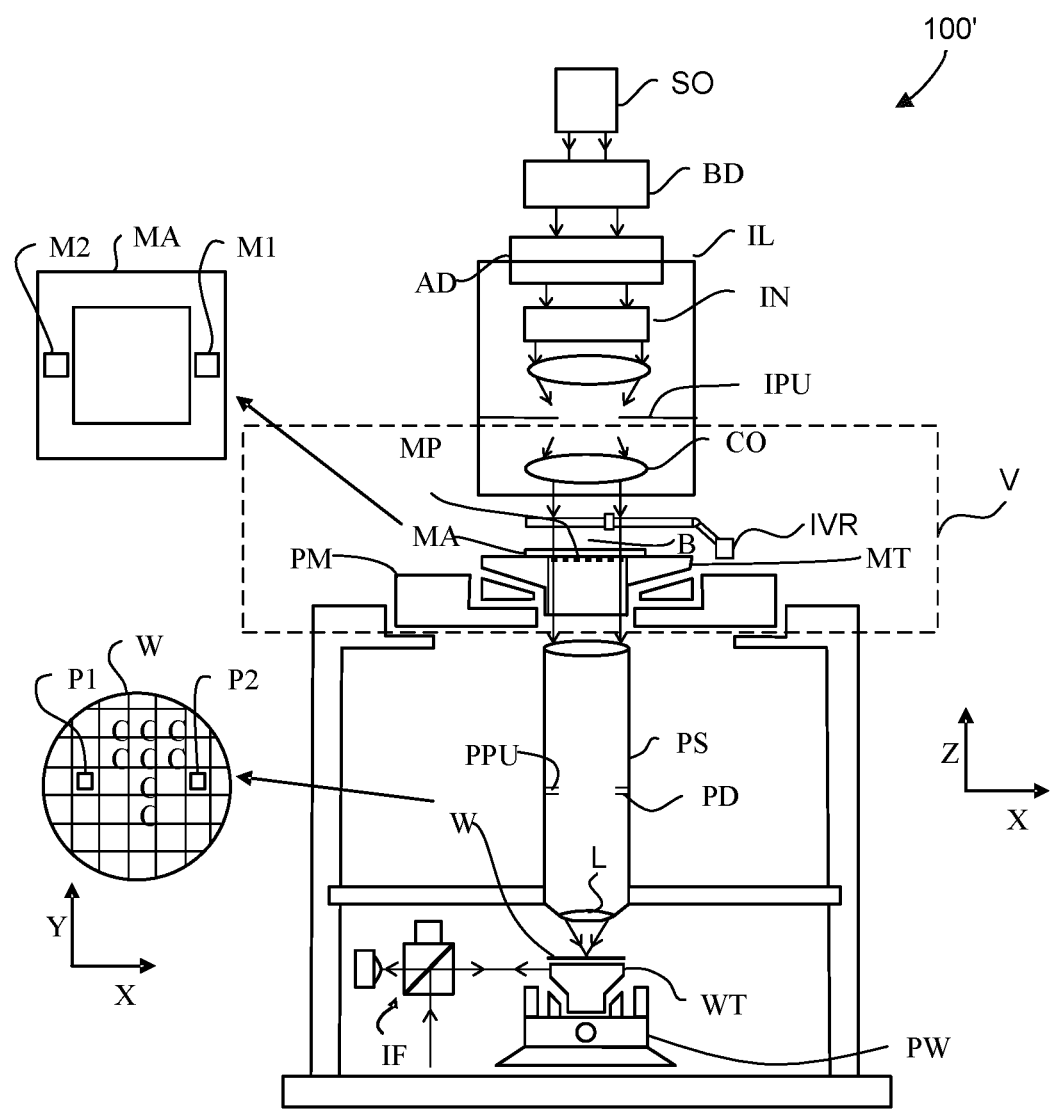
FIG. 1B shows a schematic of a transmissive lithographic apparatus, according to some embodiments.

FIGS. 1A and 1B show schematic illustrations of a lithographic apparatus 100 and lithographic apparatus 100', respectively, in which embodiments of the present disclosure may be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT may be a frame or a table, for example, which may be fixed or movable, as required. By using sensors, the support structure MT may ensure that the patterning device MA is at a desired position, for example, with respect to the projection system PS.

The term "patterning device" MA should be broadly interpreted as referring to any device that may be used to impart a radiation beam B with a pattern in its cross-section, such as to create a pattern in the target portion C of the substrate W. The pattern imparted to the radiation beam B may correspond to a particular functional layer in a device being created in the target portion C to form an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, or programmable LCD panels. Masks are well known in lithography, and include mask types such as binary, alternating phase shift, or attenuated phase shift, as well as various hybrid mask types. An example of a programmable mirror array employs a matrix arrangement of small mirrors, each of which may be individually tilted so as to reflect an incoming radiation beam in different directions. The tilted mirrors impart a pattern in the radiation beam B, which is reflected by a matrix of small mirrors.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

Lithographic apparatus 100 and/or lithographic apparatus 100' may be of a type having two (dual stage) or more substrate tables WT (and/or two or more mask tables). In such "multiple stage" machines, the additional substrate tables WT may be used in parallel, or preparatory steps may be carried out on one or more tables while one or more other substrate tables WT are being used for exposure. In some situations, the additional table may not be a substrate table WT.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIGS. 1A and 1B, the illuminator IL receives a radiation beam from a radiation source SO. The source SO and the lithographic apparatus 100, 100' may be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO may be an integral part of the lithographic apparatus 100, 100', for example, when the source SO is a mercury lamp. The source SO and the illuminator IL, together with the beam delivery system BD, if required, may be referred to as a radiation system.

The illuminator IL may include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator may be adjusted. In addition, the illuminator IL may comprise various other components (in FIG. 1B), such as an integrator IN and a condenser CO. The illuminator IL may be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT may be moved accurately (for example, so as to position different target portions C in the path of the radiation beam B). Similarly, the first positioner PM and another position sensor IF1 may be used to accurately position the patterning device (for example, mask) MA with respect to the path of the radiation beam B. Patterning device (for example, mask) MA and substrate W may be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil conjugate PPU to an illumination system pupil IPU. Portions of radiation emanate from the intensity distribution at the illumination system pupil IPU and traverse a mask pattern without being affected by diffraction at the mask pattern and create an image of the intensity distribution at the illumination system pupil IPU.

The projection system PS projects an image MP' of the mask pattern MP, where image MP' is formed by diffracted beams produced from the mark pattern MP by radiation from the intensity distribution, onto a photoresist layer coated on the substrate W. For example, the mask pattern MP may include an array of lines and spaces. A diffraction of radiation at the array and different from zeroth order diffraction generates diverted diffracted beams with a change of direction in a direction perpendicular to the lines. Undiffracted beams (i.e., so-called zeroth order diffracted beams) traverse the pattern without any change in propagation direction. The zeroth order diffracted beams traverse an upper lens or upper lens group of the projection system PS, upstream of the pupil conjugate PPU of the projection system PS, to reach the pupil conjugate PPU. The portion of the intensity distribution in the plane of the pupil conjugate PPU and associated with the zeroth order diffracted beams is an image of the intensity distribution in the illumination system pupil IPU of the illumination system IL. The aperture device PD, for example, is disposed at or substantially at a plane that includes the pupil conjugate PPU of the projection system PS.

The projection system PS is arranged to capture, by means of a lens or lens group L, not only the zeroth order diffracted beams, but also first-order or first- and higher-order diffracted beams (not shown). In some embodiments, dipole illumination for imaging line patterns extending in a direction perpendicular to a line may be used to utilize the resolution enhancement effect of dipole illumination. For example, first-order diffracted beams interfere with corresponding zeroth-order diffracted beams at the level of the wafer W to create an image of the line pattern MP at highest possible resolution and process window (i.e., usable depth of focus in combination with tolerable exposure dose deviations). In some embodiments, astigmatism aberration may be reduced by providing radiation poles (not shown) in opposite quadrants of the illumination system pupil IPU. Further, in some embodiments, astigmatism aberration may be reduced by blocking the zeroth order beams in the pupil conjugate PPU of the projection system associated with radiation poles in opposite quadrants. This is described in more detail in U.S. Pat. No. 7,511,799 B2, issued Mar. 31, 2009, which is incorporated by reference herein in its entirety.

With the aid of the second positioner PW and position sensor IF (for example, an interferometric device, linear encoder, or capacitive sensor), the substrate table WT may be moved accurately (for example, so as to position different target portions C in the path of the radiation beam B). Similarly, the first positioner PM and another position sensor (not shown in FIG. 1B) may be used to accurately position the mask MA with respect to the path of the radiation beam B (for example, after mechanical retrieval from a mask library or during a scan).

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner), the mask table MT may be connected to a short-stroke actuator only or may be fixed. Mask MA and substrate W may be aligned using mask alignment marks M1, M2, and substrate alignment marks P1, P2. Although the substrate alignment marks (as illustrated) occupy dedicated target portions, they may be located in spaces between target portions (known as scribe-lane alignment marks). Similarly, in situations in which more than one die is provided on the mask MA, the mask alignment marks may be located between the dies.

Mask table MT and patterning device MA may be in a vacuum chamber V, where an in-vacuum robot IVR may be used to move patterning devices such as a mask in and out of vacuum chamber. Alternatively, when mask table MT and patterning device MA are outside of the vacuum chamber, an out-of-vacuum robot may be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' may be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C may be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT may be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes a programmable patterning device, such as a programmable mirror array.

Combinations and/or variations on the described modes of use or entirely different modes of use may also be employed.

In some embodiments, a lithographic apparatus may generate DUV and/or EUV radiation. For example, lithographic apparatus 100' may be configured to operate using a DUV source. In another example, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
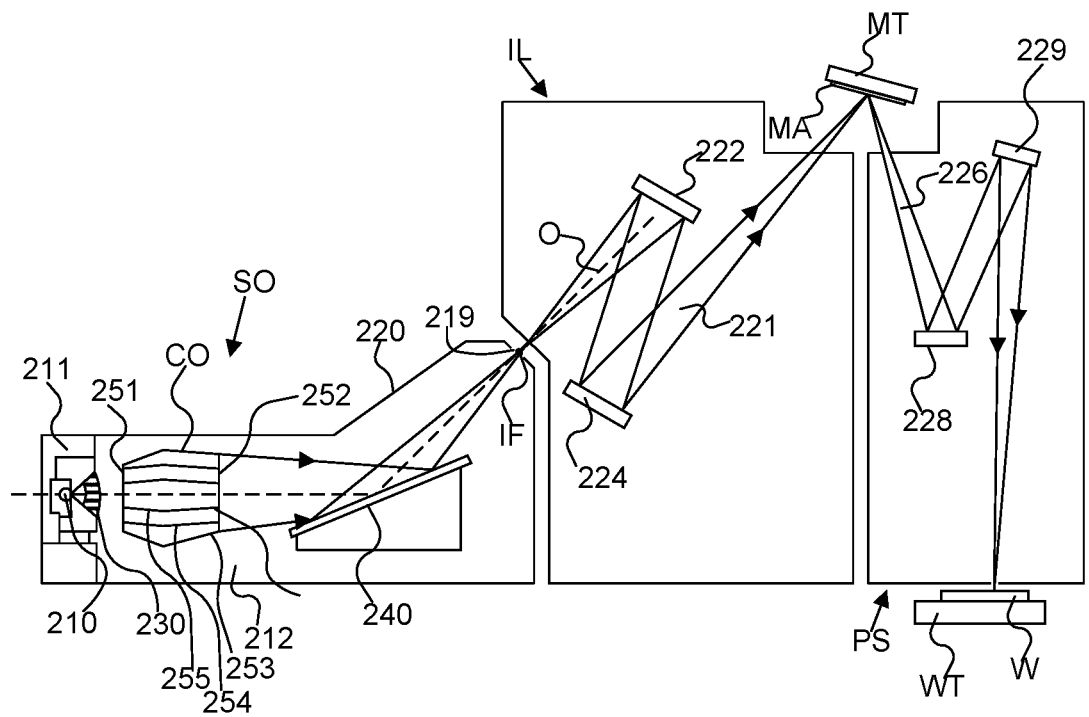
FIG. 2 shows a more detailed schematic of the reflective lithographic apparatus, according to some embodiments.

FIG. 2 shows the lithographic apparatus 100 in more detail, including the source collector apparatus SO, the illumination system IL, and the projection system PS. The source collector apparatus SO is constructed and arranged such that a vacuum environment may be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor, or Sn vapor in which the very hot plasma 210 is created to emit radiation in the EUV range of the electromagnetic spectrum. The very hot plasma 210 is created by, for example, an electrical discharge causing at least a partially ionized plasma. Partial pressures of, for example, 10 Pa of Xe, Li, Sn vapor, or any other suitable gas or vapor may be required for efficient generation of the radiation. In some embodiments, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap), which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure.

The collector chamber 212 may include a radiation collector CO, which may be a so-called grazing incidence collector. Radiation collector CO has an upstream radiation collector side 251 and a downstream radiation collector side 252. Radiation that traverses collector CO may be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the FIG. 2, for example there may be one to six additional reflective elements present in the projection system PS than shown in FIG. 2.

Collector optic CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a collector optic CO of this type is preferably used in combination with a discharge produced plasma source, often called a DPP source.

Exemplary Lithographic Cell

Figure 3:
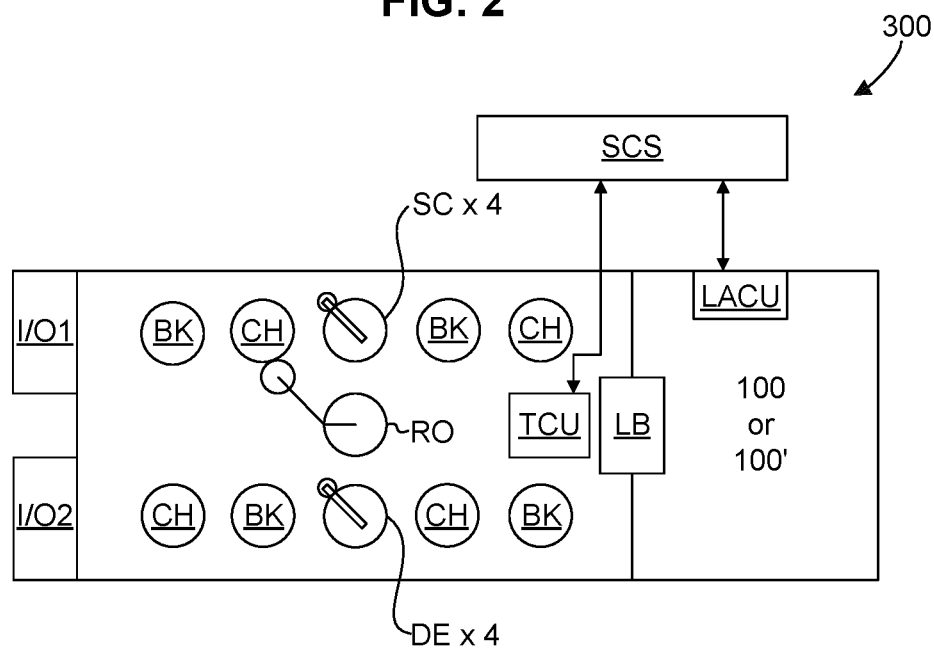
FIG. 3 shows a schematic of a lithographic cell, according to some embodiments.

FIG. 3 shows a lithographic cell 300, also sometimes referred to a lithocell or cluster, according to some embodiments. Lithographic apparatus 100 or 100' may form part of lithographic cell 300. Lithographic cell 300 may also include one or more apparatuses to perform pre- and post-exposure processes on a substrate. Conventionally these include spin coaters SC to deposit resist layers, developers DE to develop exposed resist, chill plates CH, and bake plates BK. A substrate handler, or robot, RO picks up substrates from input/output ports I/O1, I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses may be operated to maximize throughput and processing efficiency.

Exemplary Contaminant Inspection Apparatus

In some embodiments, a metrology system may be used to inspect an object in order to determine a cleanliness of the object. Inspection techniques may be performed such that undesirable defects on a surface (e.g., a surface of a reticle or substrate) are successfully detected while minimizing false detections (or false positives). Inspection techniques may comprise optical inspection.

The term "imperfection," "defect," "blemish," and the like may be used herein to refer to deviations or non-uniformities of structures from a specified tolerance. For example, a flat surface may have defects such as scratches, holes, or recesses, foreign particles, stains, and the like.

In the context of imperfections, the terms "foreign particle," "contaminant particle," "contaminant," and the like may be used herein to refer to unexpected, atypical, undesirable, or the like (herein undesirable) particulate matter that is present in a region or on a surface that was not designed to tolerate the presence of the undesirable particulate matter or otherwise adversely impacts operation of the apparatus on which the particulate matter is present. Some examples of foreign particles may include dust, stray photoresist, or other dislodged materials within the lithographic apparatus. Examples of dislodged materials may include steel, Au, Ag, Al, Cu, Pd, Pt, Ti, and the like. Material dislodging may occur due to, e.g., processes of fabricating metal interconnects on substrates and friction and impacts of actuated structures. Contaminants may make their way onto sensitive parts in the lithographic apparatus (e.g., reticle or substrate) and increase the likelihood of errors in lithographic processes. Embodiments of the present disclosure provide structures and functions for detecting defects on sensitive parts of a lithographic apparatus or process.

False positives are detrimental to lithography. For example, a false positive detection may slow down production by unnecessarily prompting a maintenance action (e.g., reticle replacement) or even recommending discarding a perfectly conforming reticle. Embodiments of the present disclosure provide structures and functions for reducing instances or eliminating false positives.

Figure 4:
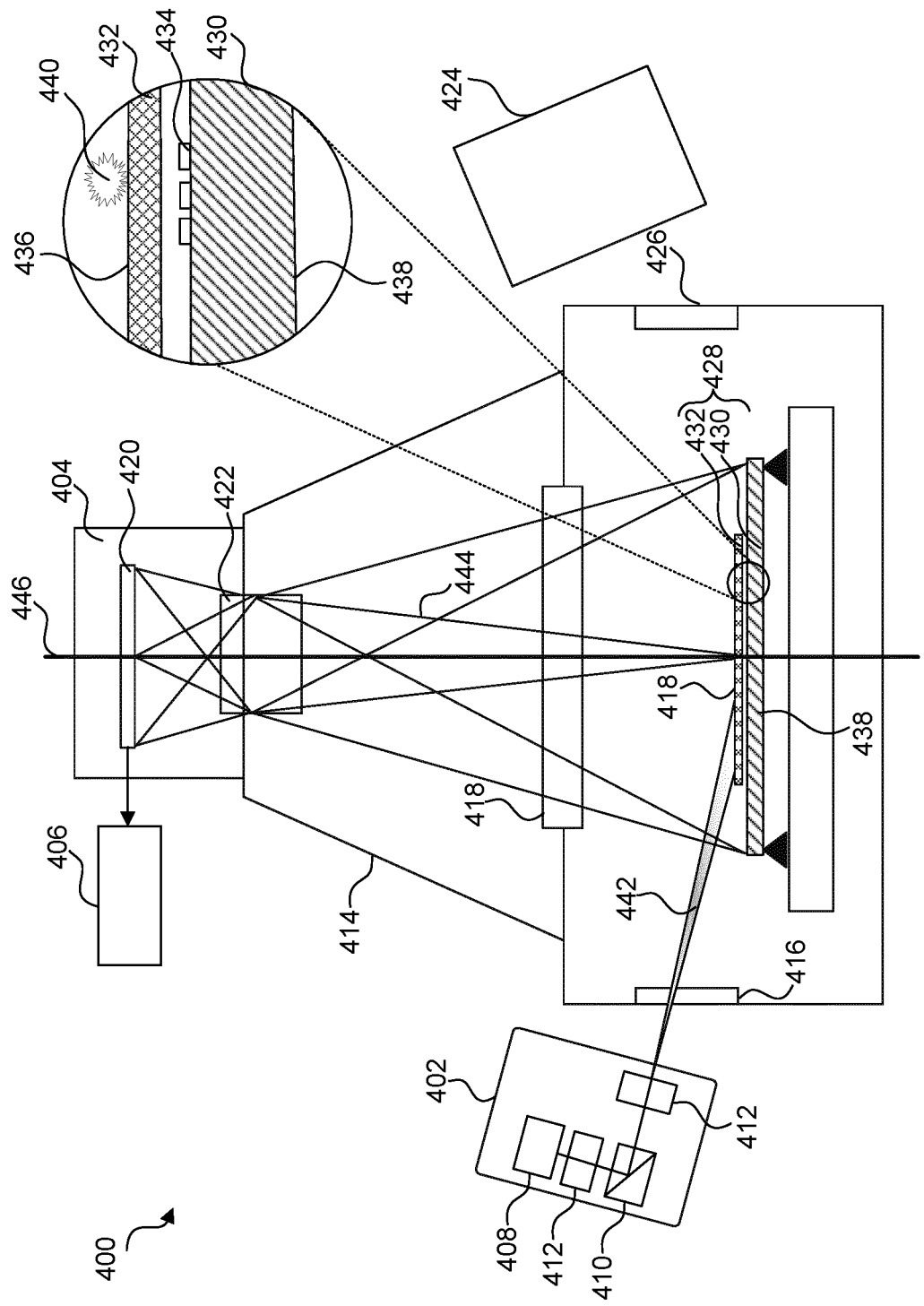

FIG. 4 shows a schematic of a metrology system 400, according to some embodiments. In some embodiments, metrology system 400 may be implemented in a lithographic apparatus. Metrology system 400 may comprise an illumination system 402, a detector 404, and a processor 406. Illumination system 402 may comprise a radiation source 408 and a spatial light modulator 410. Illumination system 402 may comprise one or more radiation adjusting elements 412 (e.g., any of polarizers, wavelength filters, focusing elements, beam splitters, beam combiners, and the like). Metrology system 400 may comprise an enclosure 414. Enclosure 414 may comprise one or more compartments. Enclosure 414 may comprise viewport windows 416 and 418. Metrology system 400 may comprise one or more additional illumination systems 424. Illumination system 424 may be substantially similar to illumination system 402 in structure and function. Enclosure 414 may comprise one or more additional viewport windows 426.

In some embodiments, detector 404 may comprise a sensor element 420 and a focusing element 422 (e.g., an objective lens or lens system). In some embodiments, detector 404 may be a single-cell photo-detector (without more, may not be able to resolve an image), in which case sensor element 420 may be a photo-sensitive diode. In some embodiments, detector 404 may be an image capture device or a multi-cell photo-detector (e.g., two dimensional array of photo-detectors). Sensor element 420 may comprise a charge-coupled device (CCD) or a complementary metal-oxide-semiconductor (CMOS).

Before describing embodiments of metrology system 400 in more detail, however, it is instructive to present examples of an object 428 that may be inspected using metrology system 400. In some embodiments, object 428 may comprise a contiguous object or a multi-part object (FIG. 4 shows a magnified view of the multi-part variant). In embodiments where object 428 may have multiple parts, object 428 may be a reticle 430 having a pellicle 432 disposed on a side of reticle 430. Reticle 430 may comprise pattern features 434. Pattern features 434 may comprise, for example, product and alignment mark patterns to be transferred onto a substrate via a lithographic process. The quality of pattern transfer may be negatively impacted if a defect 440 is present on reticle 430, particularly on pattern features 434. Thus, pellicle 432 may be a transparent protector configured to prevent defect 440 from landing on the side of reticle 430 that hosts pattern features 434.

In some embodiments, object 428 may comprise a surface 436 and 438. Surface 436 is disposed on a side of object 428 that is opposite of surface 438. Surface 436 may be configured to contact and prevent defect 440 from reaching pattern features 434 (e.g., defect 440 is shown disposed on surface 436). Surface 438 may be a backside surface (e.g., the non-feature side) of reticle 430. Object 428 may be arranged such that a gap exists between pellicle 432 and reticle 430. The gap may be in the range microns to millimeters. As a result of the distance between surface 436 and pattern features 434, defect 440 residing on surface 436 has a reduced likelihood of influencing a pattern transfer, since defect 440 may be out of focus with respect to the illumination used in a pattern transfer. However, it is still desirable to monitor surface 436 of pellicle 432 to prevent counts of foreign particles from reaching unacceptable levels. Conversely, a foreign particle on surface 438 of reticle 430 may also negatively impact lithography, since a foreign particle may print through or otherwise distort a shape of reticle 430 when the foreign particle is sandwiched between reticle 430 and a reticle table, or cause damage to the reticle or reticle table surfaces when sandwiched between them, or transfer to the reticle table and thus contaminate it and potentially contaminate or damage other reticles loaded on the same stage.

In some embodiments, radiation source 408 may generate a beam of radiation 442 to illuminate object 428. Beam of radiation 442 may comprise incoherent radiation. It should be appreciated that beam of radiation 442 may be sourced with a coherent source. Beam of radiation 442 may comprise a wavelength (e.g., a narrow bandwidth centered about a central wavelength). Beam of radiation 442 may comprise two or more wavelengths (e.g., multiple discrete narrow bands or a continuum). One or more radiation adjusting elements 412 (e.g., wavelength filters) may be used to select wavelengths to be used for illuminating object 428. Additionally or alternatively, radiation source 408 may comprise two or more discrete radiation sources to generate distinct portions of the two or more wavelengths.

In some embodiments, spatial light modulator 410 may direct beam of radiation 442 toward surface 436 of object 428. Spatial light modulator 410 may adjust a spatial intensity distribution of beam of radiation 442 at surface 436. That is, the illumination directed onto object 428 may be selectable at a pixel level, as opposed to, e.g., flood illumination. Spatial light modulator 410 may comprise a liquid crystal modulator. Spatial light modulator 410 may also comprise an illumination-directing element (e.g., a reflector) and/or polarizer. Liquid crystals may operate based on polarization of light. For example, a pixel element of a liquid crystal device may allow full transmission, partial transmission, or no transmission of radiation based on a polarization state of the liquid crystal pixel element.

In some embodiments, spatial light modulator 410 may comprise a digital micromirror device (DMD). DMDs may operate based on mechanically movable micromirrors that reflect light toward a desired location. Therefore, it may seem that DMDs are limited to only "fully on" (reflecting toward target) or "fully off" (not reflecting toward target) states. However, DMD pixel elements are capable of toggling at frequencies (i.e., refresh rates) in the order $10^3$-$10^4$ Hz. By contrast, detector 404 may only have a sampling rate in the order of 10-$10^2$ Hz. By exploiting the speed of a DMD, it is possible to define "partial on" states of DMD, for example, by illuminating a target for only a fraction of one sampling period of detector 404.

In some embodiments, spatial light modulator 410 may employ optical elements (e.g., pixel elements) with spatially variable transmission profile capable of generating required intensity profile through projection/illumination system at the object plane. The may be, for example, chrome on glass patterns, photographic films with desirable transmission profiles, and the like.

In some embodiments, detector 404 may receive radiation, represented by detected radiation 444, scattered at surface 436 and by structures near the surface (e.g., pattern features 434). Detected radiation 444 scattered at surface 436 may include radiation scattered by defect 440 that is disposed on surface 436. Detector 404 may generate a detection signal based on the received radiation. Processor 406 may receive and analyze the detection signal. Processor 406 may determine a location of a defect on the surface based on the analyzing. Processor 406 may generate a first image based on the detection signal. Processor 406 may distinguish between a spurious signal and a signal corresponding to a presence of defect 440 on surface 436 based on the analyzing and the adjusted spatial intensity distribution. That is, metrology system 400 is capable of discriminating between two types of detected radiation: (1) radiation associated with defect 440 (e.g., true detection of a foreign particle) and (2) radiation associated with structures other than defect 440 (e.g., false positive due to a spurious signal from radiation scattered by pattern features 434).

In the context of detection of radiation, the terms "false," "spurious," "ghost," "parasitic," and the like may be used to describe signals associated with radiation that does not interact with a foreign particle. For example, a spurious signal may be associated with detected radiation that would make it appear as though a defect was positively detected at a location when no defect is present at the location.

In some embodiments, the distinguishing performed by processor 406 may comprise determining a binary presence (e.g., present or not present) of defect 440. In some embodiments, the distinguishing performed by processor 406 may comprise determining a degree of confidence (e.g., a percentage probability) to a potential presence of defect 440. Processor 406 may determine a position and/or size of defect 440 based on the detection signal. Processor 406 may present detection results to a user of metrology system 400 (e.g., on a computer display). Detection results may comprise, for example, any of presence, position, and/or size of defect 440, captured images, spectral analysis, and the like.

In the context of a surface (e.g., surface 436), the term "lateral" may be used herein to refer to a direction along the plane of the surface. For example, an X and Y nomenclature may be used as location coordinates for representing a lateral position on surface 436. In another example, a lateral direction may be perpendicular to an optical axis 446 of metrology system 400.

In some embodiments, a lateral resolution of metrology apparatus 400 may be physically limited by optical elements thereof (e.g., numerical aperture (NA), aberration, correction limitations, assembly limitations, and the like). In some embodiments, the NA of focusing element 422 may be 0.055, averaged over the observation plane. These conditions may cause difficulties for resolving a location of defect 440, especially if the size of defect 440 is smaller than a half-diameter of the Airy disk of the detection-side optics. It is inconvenient to be able to determine a presence and size, but not location, of defect 440 when it has a diameter smaller than diffraction limit of an metrology system 400. Lateral resolution of metrology system 400 may be approximated by the Rayleigh equation:

$$r_o = \frac{0.61\lambda}{NA} \quad (1)$$

In equation 1, $r_o$ is the resolution limit, $\lambda$ is the wavelength of beam of radiation 442, and NA is the numerical aperture of metrology apparatus 400. Regarding a lateral resolution $r_d$ of detector 404, it may be approximated by $r_d$=2w, where w is a width of the detector elements (e.g., pixels) of detector 404. In some embodiments, lateral resolution of metrology system 400 may be limited by the lower of $r_o$ or $r_d$. Or, in an extreme case, detector 404 may have no lateral resolution (e.g., a single-cell photo-detector).

In some embodiments, the term "detector element" may be used herein to refer to an individual, radiation-sensitive element of a detector. For example, a detector element in a multi-cell detector may be associated with a pixel of an image generated based on the detection made by the multi-cell detector.

In some embodiments, minimum size of detectable particle(s) may be limited by a noise floor of metrology system 400. Metrology system 400 may correctly identify and determine sizes of foreign particles that are approximately 5 μm and larger. By comparison, determinations of a lateral position of defect 440 may have uncertainties that are approximately an order of magnitude larger and may be difficult to improve upon due to lateral resolution limits as described above. However, some embodiments of the present disclosure may exploit properties of radiation (e.g., spatial modulation) from a high resolution illumination system (e.g., illumination system 402) to condition radiation received at detector 404 such that an optical resolution of detection may be enhanced.

Figure 5A:
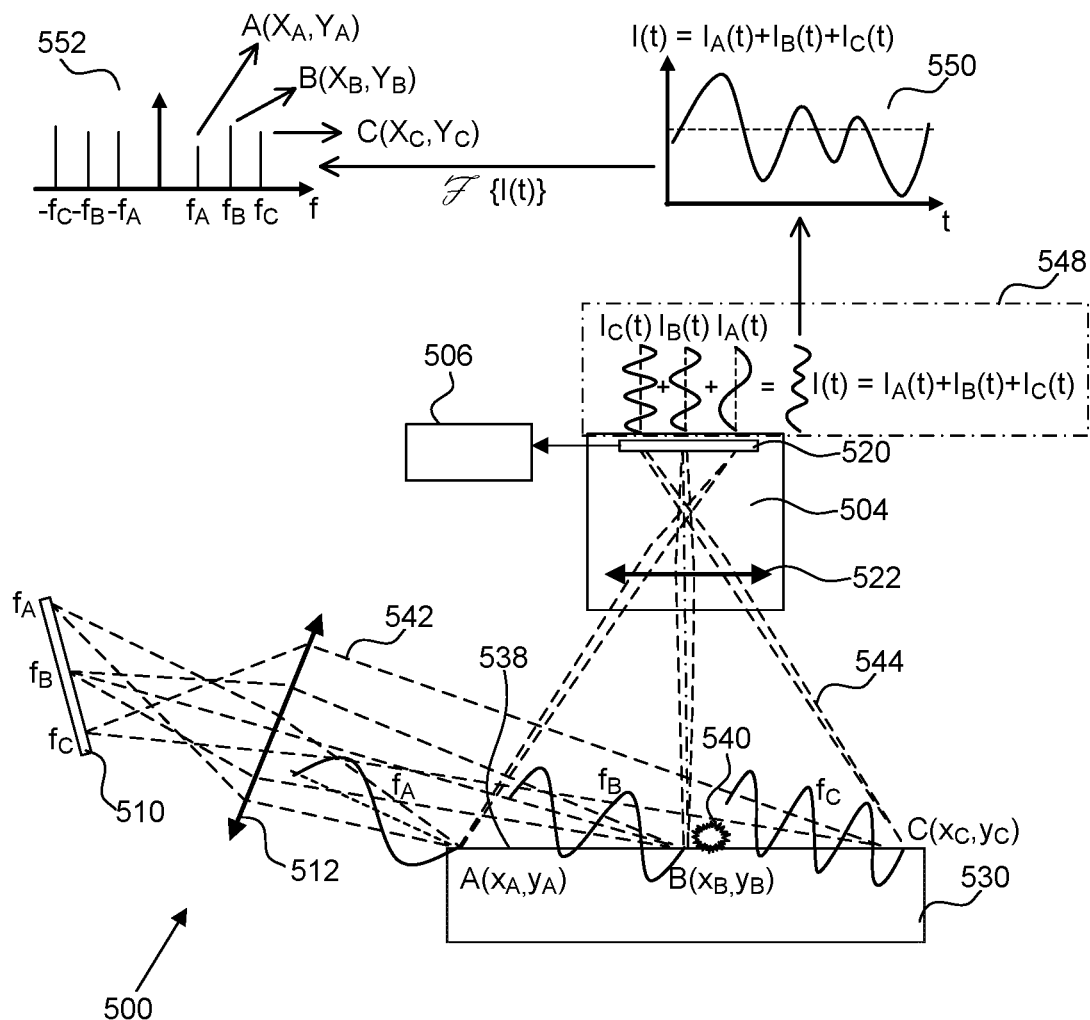

FIG. 5A shows a schematic of a metrology system 500, according to some embodiments. It should be appreciated that any of the structures and functions described in reference to FIG. 4 may also be included in embodiments referencing FIG. 5A. For example, in some embodiments, illumination system 424 (FIG. 4) may be included in embodiments referencing FIG. 5A. Unless otherwise noted, elements of FIG. 5A that have similar reference numbers (e.g., reference numbers sharing the two right-most numeric digits) as elements of FIG. 4 may have similar structures and functions.

In some embodiments, metrology system 500 may be used to inspect a reticle 530 for presence of foreign particles (e.g., defect 540). Metrology system 500 may comprise an illumination system having a spatial light modulator 510 and a focusing element 512. Metrology system may comprise a detector 504 and a processor 506. Detector 504 may comprise a sensor element 520 and a focusing element 522.

In some embodiments, spatial light modulator 510 may be configured to temporally adjust the spatial intensity distribution of a beam of radiation 542 generated by the illumination system. For example, spatial light modulator 510 may modulate given regions of beam of radiation 542 at frequencies, for example, $f_A$, $f_B$, and $f_C$, among frequencies. The frequencies may be different from each other. An illumination intensity of beam of radiation 542 at a location A, represented by coordinates $(X_A, Y_A)$, on a surface 538 of reticle 530 may be modulated (e.g., via a sinusoidal pattern, periodic pattern, and the like) at frequency $f_A$. An illumination intensity of beam of radiation 542 at a location B, represented by coordinates $(X_B, Y_B)$, on surface 538 may be modulated at frequency $f_B$. An illumination intensity of beam of radiation 542 at a location C, represented by coordinates $(X_C, Y_C)$, on surface 538 may be modulated at frequency $f_C$. Locations A, B, and C may be different from each other. The intensity modulation of beam of radiation 542 may be represented, e.g., by the following:

$$I_i(t) = DC_i + A_i \cos(2\pi f_i t + \phi_i) \quad (2)$$

In equation 2, index i associates a location on surface 538 (e.g., i=A, B, or C), $DC_i$ is a constant intensity offset at location i, $A_i$ is an amplitude of intensity modulation at location i, $f_i$ is a frequency of the intensity modulation at a location i (e.g., $f_A$), and $\phi_i$ is an initial phase at location i. The constant intensity offset $DC_i$ and the amplitude $A_i$ may be different depending on the location, for example, to account for differences in reflectivity of reticle 530.

The term "spatial encoding," "spatial information encoding," and the like may be used herein to refer to using properties of modulated illumination to correlate a position in space with a distinguishing property of the modulated illumination.

In some embodiments, detector 504 may receive radiation, represented by detected radiation 544, scattered at surface 538. Detected radiation 544 scattered at surface 538 may include radiation scattered by defect 540 that is disposed on surface 538. Detector 504 may generate a detection signal based on the received radiation.

In some embodiments, the NA of focusing element 522 may be such that a lateral resolution of metrology system 500 is limited (e.g., NA is approximately 0.055). In some embodiments, detector 504 may be a single-cell photo-detector, severely restricting a lateral resolution of metrology system 500. However, a single-cell photo-detector may be desirable in instances where size, ease of assembly, and/or cost-efficiency are appreciable factors.

To overcome poor lateral resolution, in some embodiments, spatial modulation of illumination at different modulation frequencies (e.g., $f_A$, $f_B$, and $f_C$) may be used for reconstructing an image even when using a low resolution detection setup (e.g., mapping a detected modulation frequency to a coordinate on surface 538). For example, radiation that scatters from locations A, B, and C may be respectively associated with modulation frequencies $f_A$, $f_B$, and $f_C$ used for spatially modulating beam of radiation 542. Subsequently, detected radiation 544 may have corresponding modulation frequencies $f_A$, $f_B$, and/or $f_C$ and the temporal pattern of detected radiation 544 may be a superposition of the different sinusoidal modulation patterns as illustrated in inset 548.

In some embodiments, processor 506 may analyze the detection signal. The analysis may comprise an analysis based on the modulating (e.g., frequency analysis). Processor 506 may determine properties of detected radiation 544, such as, e.g., modulation frequencies present in detected radiation 544 and amplitude and/or phase corresponding to each of the modulation frequencies. Since locations A, B, and C are illuminated with distinguishing modulation parameters (e.g., respective modulation frequencies $f_A$, $f_B$, and $f_C$ and/or phases), processor 506 may reconstruct an image that represents locations A, B, and C by assigning each location an intensity determined by the frequency analysis. In this manner, an intensity corresponding to each of modulation frequencies $f_A$, $f_B$, and $f_C$ may be mapped to respective locations A, B, and C on the reconstructed image.

In some embodiments, the frequency analysis performed by processor 506 may comprise a Fourier or cosine transform analysis. Temporal intensity profile 550 represents a plot of the intensity $I(t)=I_A(t)+I_B(t)+I_C(t)$ of detected radiation 544. The vertical axis of temporal intensity profile 550 may represent the detected intensity $I(t)$ and the horizontal axis may represent time. Time scales may be envisaged based on refresh rates of available spatial light modulators (e.g., typical maximums are in the tens of kHz). Graph 552 represents a result of applying a Fourier transform (e.g., discrete Fourier transform (DFT)) to detected intensity $I(t)$. Simpler transforms may also be used to reduce the load on processor 506, for example, fast Fourier transform (FFT), discrete cosine transform (DCT), modified DCT (MDCT), and the like. The vertical axis of graph 552 may represent amplitude or intensity of modulation. The horizontal axis of graph 552 may represent frequency of intensity modulation (e.g., in kHz). A position of the light-scattering structure may be determined since frequency information is mapped onto surface 538. Processor 506 may then generate an image associated with surface 538 based on mapping the intensities from graph 552 onto respective locations A, B, and C of surface 538.

In some embodiments, using the features described above, metrology system 500 may achieve a lateral resolution exceeding the diffraction limits of its imaging optics. That is, metrology system 500 may enhance an optical resolution of detection based on a frequency analysis of the detection signal. Lateral resolution may also be adaptable and/or non-uniform based on using customized groupings of adjustable elements in spatial light modulator 510 (e.g., variable pixel size). The use of spatially encoded illumination to enhance detector resolution may also be used with camera detectors (i.e., not limited to single-cell detectors). In this manner, the reliability of metrology system 500 may be increased by increasing its particle location reporting accuracy and/or improving the capability of the system to resolve the lateral size and shape of defect 540.

It should be appreciated that typical detectors work by using discrete exposures (e.g., frames). The exposures rely on parameters such as exposure length per frame, number of frames per unit time, and the like. Therefore, in some embodiments, a detector receiving a sinusoidal illumination pattern may detect the pattern as a series of discrete illumination intensities that follow a sinusoidal pattern. This concerns what was mentioned earlier—an illumination intensity of beam of radiation 542 at a location A, represented by coordinates $(X_A, Y_A)$, on a surface 538 of reticle 530 may be modulated (e.g., via a sinusoidal pattern) at frequency $f_A$. It should be understood that this is not limited to continuous modulation patterns, considering the context of discrete exposures.

In some embodiments, an illumination pattern could be discretized using spatial light modulator 510. The example given earlier for a DMD takes into account the discrete nature of detection by adjusting the ratio of the on/off state of a mirror element during a sampling period (e.g., a frame).

In the context of discrete exposures (e.g., frames), a permutation of a pattern may comprise a different ordering of the discrete exposures. Therefore, a pattern of illumination intensities corresponding to, e.g., a sinusoidal pattern having frequency $f_A$, may no longer appear to have a frequency and/or phase (the same logic may be applied to other patterns—B, C, and so on). However, it should be understood that the permutation of the pattern can still be within the meaning of a periodic pattern having a frequency and/or phase. For example, if a series of exposures on the detector side, results from a permutation of a pattern, an inverse permutation may be applied to the series to recover the original pattern along with its frequency and/or phase. Therefore, it should be understood that the term "periodic pattern" may be used herein to refer to a pattern that is capable of conveying information relating to periodicity, such as frequency and/or phase. That is, the term "periodic pattern" may also refer to a permutation of a pattern—which may be seemingly non-periodic or non-repeating. The permutation may still convey periodicity information. A permutation of a pattern may also be referred to as having a sequence of intensity states that has been varied relative to an orderly original sequence of the periodic pattern (where the original orderly sequence follows a sine shape, cosine shape, or the like). Furthermore, it should be appreciated that a periodic pattern need not complete a full period or be repeated. For example, a pattern that corresponds to only a half-period of a cosine (permutation or otherwise) may be referred to as a periodic pattern capable of conveying frequency.

Figure 5B:
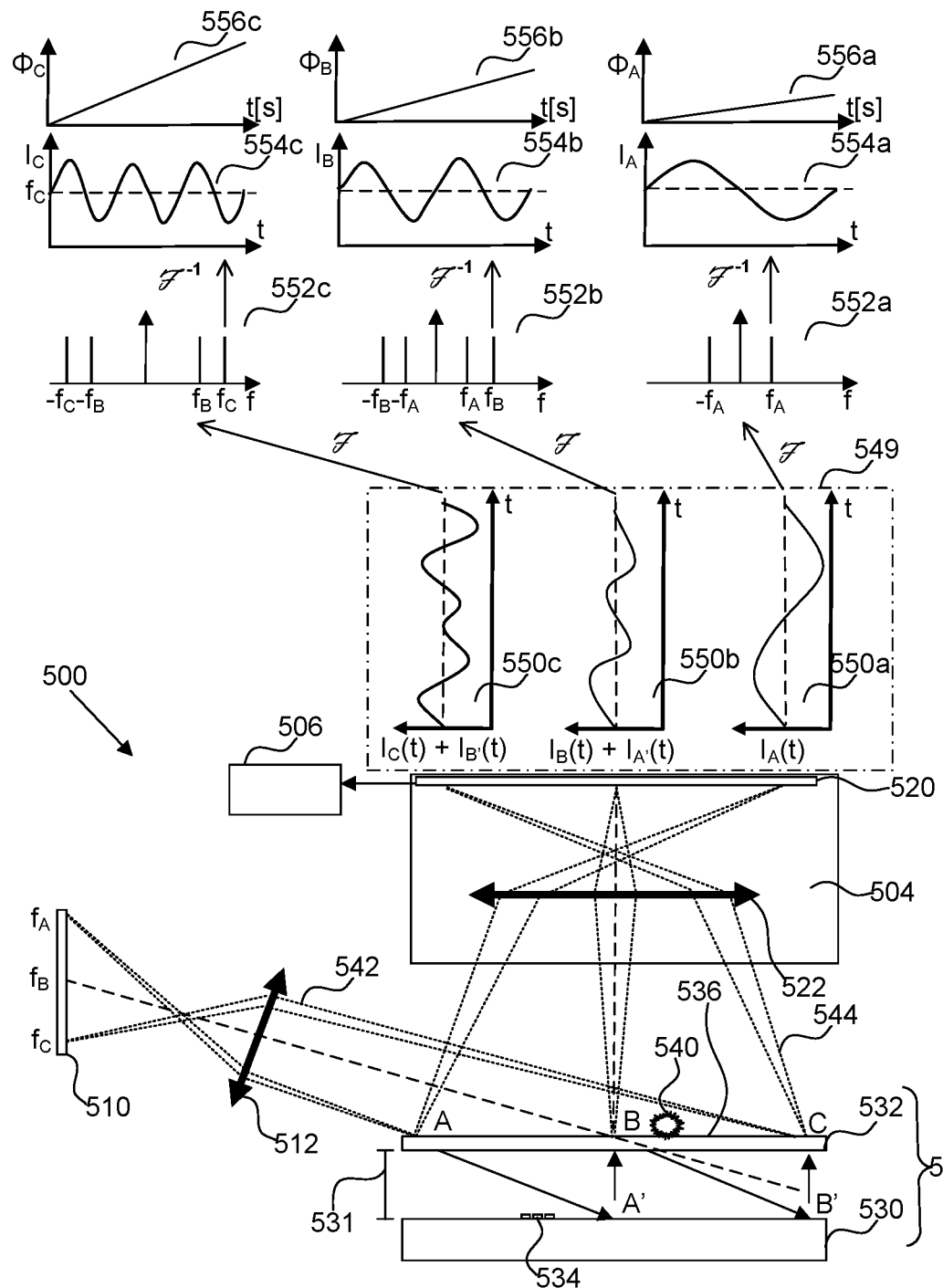

FIG. 5B shows a schematic of metrology system 500 in the context of spurious signals, according to some embodiments. In some embodiments, the spatial encoding functions described in reference to FIG. 5A may be used to distinguish detections of a foreign-particle signal and a spurious signal. It should be appreciated that any of the structures and functions described in reference to FIGS. 4 and 5A may also be included in embodiments referencing FIG. 5B. For example, in some embodiments, illumination system 424 (FIG. 4) may be included in embodiments referencing FIG. 5A. Unless otherwise noted, elements of FIG. 5B that have similar reference numbers as elements of FIGS. 4 and 5A may have similar structures and functions (e.g., reference numbers sharing the two right-most numeric digits).

In some embodiments, metrology system 500 may be used to inspect a surface 536 of a pellicle 532. Object 528 may comprise reticle 530 and pellicle 532. Reticle 530 and pellicle 532 may be separated by a gap 531. Gap 531 may be in the range microns to millimeters. Reticle 530 may comprise pattern features 534. Pattern features 534 may be disposed in gap 531.

In some embodiments, detector 504 may be an image capture device or a multi-cell photo-detector (e.g., two dimensional array of photo-detectors). Sensor element 520 may comprise a charge-coupled device (CCD) or a complementary metal-oxide-semiconductor (CMOS). Detector 504 may receive radiation scattered at surface 536—that is, detected radiation 544. Detected radiation 544 may include radiation scattered by defect 540 that is disposed on surface 536 and other undesirable sources that may lead to spurious signals. Detector 504 may generate a detection signal based on the received radiation.

In some embodiments, pellicle 532 may be transparent and allow transmission of a portion of beam of radiation 542. Radiation transmitted at location A may then be incident at a location A' on reticle 530. Pattern features 534 on reticle 530 may be disposed at or near location A'. Location A' may be directly beneath or near to location B on pellicle 532. Then, radiation scattered at location A' and toward detector 504 may have an optical path that is similar to radiation scattered from location B and toward detector 504. From the perspective of signal detection, it would appear that a foreign particle may be present at location B if radiation scattered at location A' is received at detector 504. However, since the radiation from location A' does not originate from a foreign particle, the detection of the radiation from location A' may correspond to a spurious signal. A similar relationship is applicable to locations C and B'.

In some embodiments, processor 506 may generate a first image associated with surface 536 based on the detection signal. The first image may correspond to radiation received at one or more detector elements of detector 504 at a given instance in time. Processor 506 may generate one or more additional images image associated with surface 536 based on the detection signal. The one or more additional images correspond to mutually different instances in time different from an instance in time of the first image. By generating a plurality of sequential images, detector elements of detector 504 may contribute, to the detection signal, temporal intensity profiles as shown in inset 549. Inset 549 shows temporal intensity profiles 550a, 550b, and 550c generated by detector elements of detector 504 that correspond to locations A, B, and C on surface 536. The horizontal axes of temporal intensity profiles 550a, 550b, and 550c may represent a detected intensity and the vertical axes may represent time.

It should be appreciated that, in some embodiments, generating an image may also include circumstances where only a subset of detector elements are used. For example, processor 506 may ignore contributions from detector elements where the detected optical energy is below a threshold such that only 'lit' regions of detector 504 are considered (e.g., to reduce processing load). In some embodiments, when an image has not yet been generated, the concept of analyzing an image may alternatively refer to analyzing the detection signal—the detection signal carries information that is used to generate an image.

In some embodiments, spatial modulation of illumination at different modulation frequencies (e.g., $f_A$, $f_B$, and $f_C$) may be used for discriminating a signal due to defect 540 and a spurious signal (e.g., by mapping a detected modulation frequency to a coordinate on surface 536). For example, radiation that scatters from locations A, B, and C may be respectively associated with modulation frequencies $f_A$, $f_B$, and $f_C$ used for spatially modulating beam of radiation 542. Subsequently, detected radiation 544 may have corresponding modulation frequencies $f_A$, $f_B$, and/or $f_C$ and the temporal pattern of detected radiation 544 may be a superposition of the different sinusoidal modulation patterns as illustrated in inset 549.

In some embodiments, temporal intensity profile 550a may represent an intensity signal corresponding to location A (e.g., $I_A(t)$). Temporal intensity profile 550b may represent a superposition of intensity signals corresponding to locations B and A' (e.g., $I_B(t)+I_A'(t)$). Temporal intensity profile 550c may represent a superposition of intensity signals corresponding to locations C and B' (e.g., $I_C(t)+I_B'(t)$). In some embodiments, processor 506 may perform frequency analysis based on the detection signal exhibiting temporal intensity profiles 550a, 550b, and/or 550c. The frequency analysis may generally be performed as described in reference to FIG. 5A.

In some embodiments, the frequency analysis performed by processor 506 may comprise a Fourier analysis or cosine transform analysis of the detection signal. For example, graphs 552a, 552b and 552c represent results of applying a Fourier transform to detected intensities corresponding to locations A, B, and C along with any present spurious signals. The vertical axes of graphs 552a, 552b, and 552c may represent amplitude or intensity of modulation. The horizontal axis of graphs 552a, 552b, and 552c may represent frequency of intensity modulation. In graph 552a, frequency $f_A$ may be present alone since spurious signals are absent. In graph 552b, frequencies $f_B$ and $f_A$ may be present with $f_A$ associated with a spurious signal arising from location A'. In graph 552c, frequencies $f_C$ and $f_B$ may be present with $f_B$ being associated with a spurious signal arising from location B'. For clarity, FIGS. 5A and 5B show only three frequencies and it should be appreciated that more or fewer frequencies may be used. More than two frequencies may overlap at a given location.

In some embodiments, processor 506 may determine that a given frequency is associated with a spurious signal by relying on associations of detector elements of detector 504 with locations on the surface being inspected. For example, a detector element may expect to receive radiation from location A at frequency $f_A$ based on an optical arrangement of the illumination and detection branches of metrology system 500. Similarly, another detector element may expect to receive radiation from location B at frequency $f_B$ and yet another detector element may expect to receive radiation from location C at frequency $f_C$. Any uncharacteristic modulation frequencies detected at a given detector element may be determined, by processor 506, as being associated with a spurious signal. Alternatively or additionally, locations A, B, and C are illuminated with distinguishing phases. The distinguishing performed by processor 506 may comprise associating a spurious signal with a frequency and/or phase that is uncharacteristic of a location. Processor 506 may be a comparator (e.g., a device that analyzes one or more pieces of information, quantities, or values for performing a comparison). It should be appreciated that, in the scenario of a single quantity, a comparison may still be drawn with the assumption that a second value is null or noise (e.g., zero).

In some embodiments, the frequency analysis performed by processor 506 may comprise performing an inverse transform (e.g., inverse Fourier transform, $F^{-1}$) based on the information in graphs 552a, 552b, and/or 552c. The inverse transform may ignore spurious signals so as to extract signals-of-interest in time-domain, for example, as shown in graphs 554a, 554b, 554c, 556a, 556b, and 556c. In graphs 554a, 554b, and 554c, the vertical axes may represent respective intensities $I_A(t)$, $I_B(t)$, and $I_C(t)$ (e.g., superimposed spurious signals removed via frequency analysis) and the horizontal axes may represent time. In graphs 556a, 556b, and 556c, the vertical axes may represent respective phases of the filtered intensities $I_A(t)$, $I_B(t)$, and $I_C(t)$ and the horizontal axes may represent time. In this manner, frequency analysis may be used to determine a frequency, amplitude, and/or phase of modulation used to illuminate a given location on the substrate. The inverse transform may be used to reconstruct the waveform used to modulate illumination at a given location on surface 536 based on an omission of at least a modulation parameter (e.g., frequency, phase, and the like) uncharacteristic of the given location—inverse transforming only the signal-of-interest. The reliability of metrology system 500 may be increased by reducing instances of false detections.

In some embodiments, processor 506 may generate a Fourier reconstructed image of surface 536 based on signals-of-interest in graphs 552a, 552b, and 552c (e.g., spurious signals removed). In other words, Fourier reconstruction may include reconstruction of frequency and/or phase of illumination modulation at a given location while omitting frequencies and/or phases that are uncharacteristic of the given location.

Figure 6:
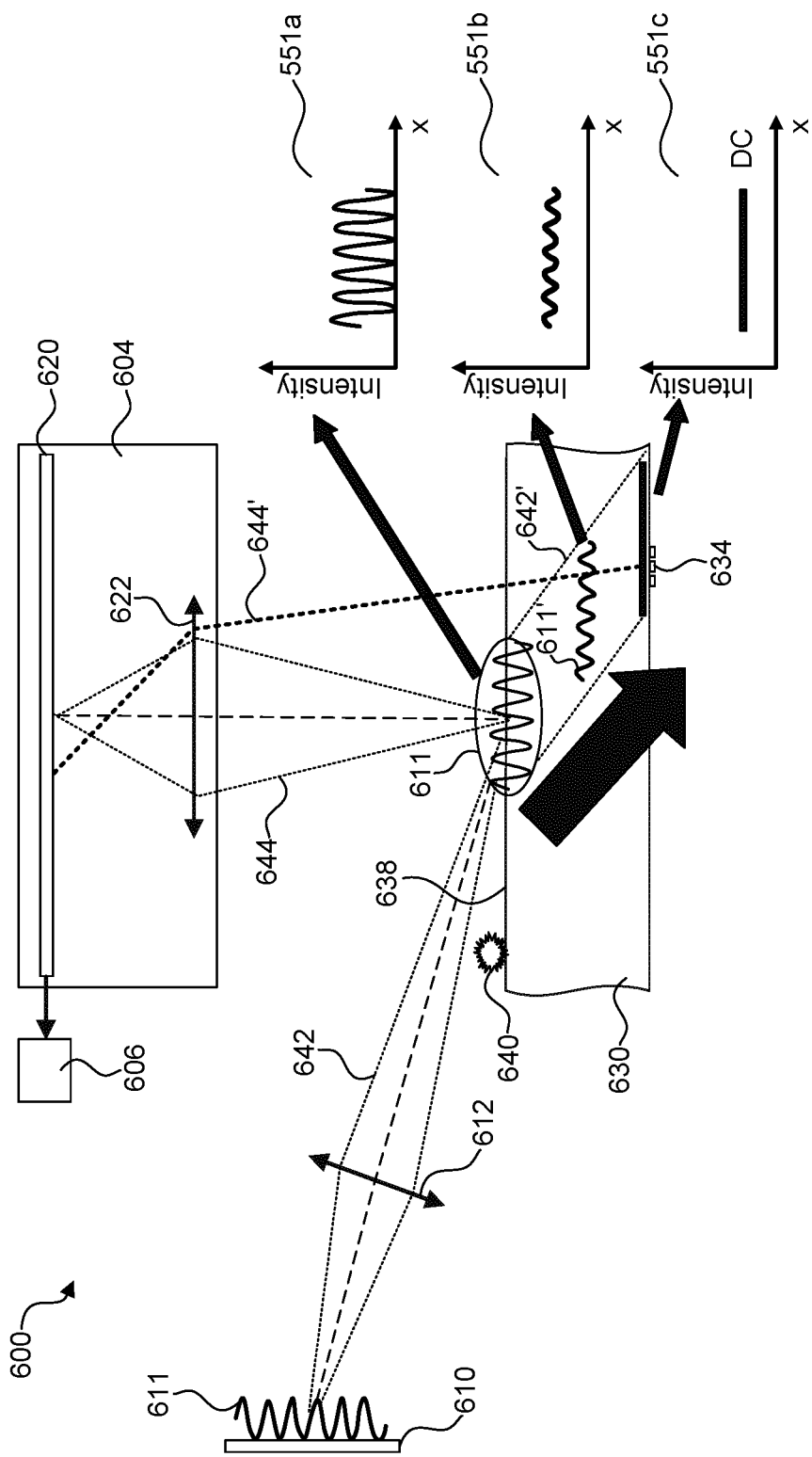

FIG. 6 shows a schematic of a metrology system 600, according to some embodiments. It should be appreciated that any of the structures and functions described in reference to FIGS. 4, 5A, and 5B may also be included in embodiments referencing FIG. 6. For example, in some embodiments, enclosure 414 (FIG. 4) may be included in embodiments referencing FIG. 6. Unless otherwise noted, elements of FIG. 6 that have similar reference numbers as elements of FIGS. 4, 5A, and 5B may have similar structures and functions (e.g., reference numbers sharing the two right-most numeric digits).

In some embodiments, metrology system 600 may be used to inspect a reticle 630 for presence of foreign particles (e.g., foreign particle 640). Metrology system 600 may comprise an illumination system having a spatial light modulator 610 and a focusing element 612. Metrology system may comprise a detector 604 and a processor 606. Detector 604 may comprise a sensor element 620 and a focusing element 622.

In some embodiments, spatial light modulator 610 may be configured to adjust a spatial intensity distribution of a beam of radiation 642 generated by the illumination system. A spatial intensity distribution of beam of radiation 642 may comprise a periodic spatial intensity distribution 611. Periodic spatial intensity distribution 611 may be projected onto a surface 638 of an object comprising a reticle 630. Reticle 630 may comprise pattern features 634. Pattern features 634 may be disposed on a surface of reticle 630 that is opposite of surface 638. Periodic spatial intensity distribution 611 may be temporally adjusted. For example, Periodic spatial intensity distribution 611 may be scanned across surface 638 or a portion thereof. In some embodiments, a phase of periodic spatial intensity distribution 611 may be adjusted such that the crests and valleys of periodic spatial intensity distribution 611 are translated across surface 638 or a portion thereof. Periodic spatial intensity distribution 611 may comprise, for example, a sinusoidal pattern, step function pattern, sawtooth pattern, triangle pattern, and the like, as well as any combinations thereof.

In some embodiments, reticle 630 may be transparent, partially transparent, or otherwise have properties that allow a portion of beam of radiation 642 to be transmitted past surface 638, represented by beam of radiation 642'. Beam of radiation 642' may comprise an evolving periodic spatial intensity distribution 611' that is initially the same as periodic spatial intensity distribution 611. The initial form of evolving periodic spatial intensity distribution 611' is shown as intensity profile 551a. As beam of radiation 642' propagates through reticle 630, evolving periodic spatial intensity distribution 611' may evolve such that a contrast of evolving periodic spatial intensity distribution 611' diminishes, e.g., becomes blurred (shown in intensity profile 551b) and/or approaches a DC-like intensity (shown in intensity profile 551c).

In some embodiments, beam of radiation 642' may illuminate structures near the surface (e.g., pattern features 634). Structures near the surface may scatter the radiation toward detector 604, represented by detected radiation 644'.

In some embodiments, detector 604 may receive radiation scattered at surface 638 (represented by detected radiation 644) as well as detected radiation 644'. Detected radiation 644 scattered at surface 636 may include radiation scattered by foreign particle 640 that is disposed on surface 638. Detector 604 may generate a detection signal based on the received radiation. As periodic spatial intensity distribution is temporally varied, detected radiation 644 may experience a corresponding modulation in intensity (e.g., flicker), whereas detected radiation 644' may experience a reduced or no modulation in intensity due to its diminished contrast as a consequence of having propagated through reticle 630. In other words, radiation scattered by the structure near the surface and received at the detector (detected radiation 644') is generated from a portion of the beam that has been transmitted through the surface (beam of radiation 642') and the transmitted portion comprises the periodic spatial intensity distribution with a diminished contrast (evolving periodic spatial intensity distribution 611').

In some embodiments, processor 606 may receive the detection signal. Processor 606 may generate a first image based on the detection signal. The first image may correspond to a first state of periodic spatial intensity distribution 611, recalling that a state of periodic spatial intensity distribution 611 may be adjusted using spatial light modulator 610. Processor 606 may generate a second image based on the detection signal. The second image may correspond to a second state of periodic spatial intensity distribution 611 that is different from the first state. Processor 606 may generate a third image based on the detection signal. The third image may correspond to a third state of periodic spatial intensity distribution 611 that is different from at least the second state (e.g., a phase shift of $2\pi$ may cause the third phase to be the same as the first phase). Processor 606 may generate further images for analysis (e.g., as a motion picture). Processor 606 may analyze the first, second, and third images to determine a location on the surface exhibiting a diminished optical response to an adjustment of a state of the periodic spatial intensity distribution. The diminished optical response may be associated with a signal that doesn't flicker because the spatial variation of intensity has been blurred to DC level. Moreover, the DC offset may be separated from the flickering part of the signal at any image location and thus effectively remove the spurious signal from the actual signal due to foreign particle 640. In other words, the spurious part may contribute a DC offset while the time varying part may be from foreign particle 640. Processor 606 may then determine that the location on the surface exhibiting the diminished optical response is due to a spurious signal and not from foreign particle 640. In this manner, the reliability of metrology system 600 may be increased by reducing instances of false detections.

Wavelength of illumination may also be used to enhance detection of foreign particles using multi-wavelength capabilities of embodiments disclosed herein. Structures and functions for generating multiple wavelengths were previously described in reference to metrology system 400 of FIG. 4 as well as transparency of object 428 (see descriptions regarding pellicle 532 (FIG. 5) and/or reticle 630 (FIG. 6)).

FIG. 7 shows a graph 700 of transmittance of a pellicle (vertical axis) versus wavelength of radiation (horizontal axis), according to some embodiments. Graph 700 shows that transmission of radiation through a pellicle (e.g., pellicle 532 of FIG. 5) is wavelength-dependent. For example, at a wavelength of 360 nm, graph 700 shows that the transmittance is approximately 0.003%. In other words, radiation having a wavelength of 360 nm may be transmitted through the pellicle and attenuated by a factor of 333. Similarly, the transmittance at 440 nm is 0.135% and the corresponding attenuation to transmission is a factor of 7.4. In the event that radiation is transmitted once through the pellicle and then scattered back toward the pellicle for a second transmission, the difference in transmitted intensities between 360 nm and 440 nm is approximately a factor of 2000. In contrast, silver debris (a common foreign particle in a lithographic apparatus) may scatter radiation toward detector 404 (FIG. 4) with a wavelength-dependent reflectivity that varies by a factor of approximately 10 when switching from 360 nm to 440 nm. Described differently, the difference in optical response at a surface of an object may be a difference between an attenuation of detected radiation by a first amount at a first wavelength and attenuation of detected radiation by a second amount at a second wavelength. The large contrast between an attenuation factor of a pellicle (e.g., 2000) and a foreign particle (e.g., 10) may be used to distinguish a spurious signal from a foreign particle. Other types of foreign particle material may comprise copper, aluminum, gold, palladium, and/or platinum. It should be appreciated that each material may be distinguished from a spurious signal according to their unique reflectivity characteristics.

In some embodiments, since the transmission is wavelength-dependent, optical measurements may exploit multi-wavelength capabilities of a metrology system to identify and discriminate foreign particle signals and spurious signals, which will be described in reference to FIG. 4. However, this should not be construed as limiting and any structures and functions described herein with respect to other figures may also be used. In some embodiments, illumination system 402 is configured to adjust a wavelength of beam of radiation 442. The first image generated by processor 406 may correspond to a first wavelength of beam of radiation 442. The second image generated by processor 406 may correspond to a second wavelength of beam of radiation 442 different from the first wavelength. Processor 406 may perform an analysis of the first and second images to determine a location on the surface exhibiting a difference in optical response of object 428 to an adjustment of the wavelength of beam of radiation 442. The distinguishing performed by processor 406 (distinguishing between a foreign particle and a spurious signal) may be based on the analysis. The distinguishing may comprise associating the spurious signal with the location on the surface exhibiting a difference in optical response that is uncharacteristic of a foreign particle.

In some embodiments, optical measurements may exploit polarization capabilities of a metrology system to identify and discriminate foreign particle signals and spurious signals. FIG. 8 shows a non-limiting arrangement of polarizers that may be used in metrology systems disclosed herein, according to some embodiments. It should be appreciated that any of the structures and functions described in reference to FIGS. 4, 5A, 5B, 6, and 7 may also be included in embodiments referencing FIG. 8. For example, in some embodiments, spatial light modulator 410 (FIG. 4) may be included in embodiments referencing FIG. 8. Unless otherwise noted, elements of FIG. 8 that have similar reference numbers as elements of FIGS. 4, 5A, 5B, 6, and 7 may have similar structures and functions (e.g., reference numbers sharing the two right-most numeric digits).

In some embodiments, an illumination system 802 may comprise radiation sources 808a and 808b, a polarizer 812a (e.g., P-polarizer), a polarizer 812b (e.g., S-polarizer), and a beam combiner 813. Polarizer 812a may be disposed downstream of radiation source 808a. Polarizer 812b may be disposed downstream of radiation source 808b. beam combiner 813 may be disposed downstream of both polarizers 812a and 812b. In some embodiments, spatial light modulator 410 (FIG. 4) may be disposed downstream of beam combiner 813.

In some embodiments, illumination system 802 may use one or both of radiation sources 808a and 808b to generate a beam of radiation 842. Radiation from radiation source 808a may be polarized by polarizer 812a. Radiation from radiation source 808b may be polarized by polarizer 812b. Polarizers 812a and 812b may be orthogonal such that beam of radiation 842 may have a selective polarization. For example, radiation source 808a may be activated alone so as to polarize beam of radiation 842 with a first polarization. Conversely, radiation source 808b may be activated alone so as to polarize beam of radiation 842 with a second polarization different from the first polarization (e.g., orthogonal polarization). Beam combiner 813 may combine optical paths of radiation sources 808a and 808b so as to allow illumination system 802 to provide selective polarization along a common optical path. Beam of radiation 842 may be directed to spatial light modulator 410 (FIG. 4) such that beam of radiation 842 is spatially modulated before illuminating object 428 (FIG. 4). Other dispositions of spatial light modulator 410 (FIG. 4) among elements of FIG. 8 may be envisaged. Spatial light modulator 410 (FIG. 4) may also provide polarization functions, for example, when embodied as a liquid crystal device.

In some embodiments, radiation sources 808a and 808b may be configured to generate multiple, selectable wavelengths. In some embodiments, radiation sources 808a and 808b may be configured to generate the same wavelength. Even if either of radiation sources 808a and 808b are fixed at a single wavelength, multiple wavelength capabilities may still be achieved via iteration of the arrangement shown in FIG. 8. That is, more than one beam combiner may be used in conjunction with additional radiation sources and polarizers. The additional radiation sources may then generate additional wavelengths. Moreover, one or more polarizers may be omitted so that illumination system 802 is capable of selectively generating polarized and unpolarized radiation.

Referring again to FIG. 4 as a non-limiting example, in some embodiments, processor 406 may generate a first and second images based on a detection signal. The first image may correspond to a first polarization. The second image may correspond to a second polarization that is different from the first polarization. Processor 406 may perform an analysis of the first and second images to determine a location on the surface exhibiting a difference in optical response to an adjustment of polarization of beam of radiation 442. Processor 406 may then determine that the location on the surface exhibiting the difference in optical response is due to a spurious signal and not from defect 440. This is possible because defect 440 may not have polarization-dependent response, whereas pattern features 434—a structure near surface 436—may have a polarization-dependent diffraction efficiency (e.g., the amount of light that is reflected is changed by polarization). Illumination scattered by pattern feature 434 and detected at detector 404 may be discriminated from a defect 440. The distinguishing may comprise associating the spurious signal with the location on the surface exhibiting the difference in optical response. Described differently, the difference in optical response at a surface of an object may be a difference between an intensity of the received radiation at the first polarization and an intensity of the received radiation at the second polarization. In this manner, the reliability of metrology system 400 may be increased by reducing instances of false detections.

FIG. 9 shows a schematic of a metrology system 900, according to some embodiments. It should be appreciated that any of the structures and functions described in reference to FIGS. 4, 5A, 5B, 6, 7, and 8 may also be included in embodiments referencing FIG. 9. For example, in some embodiments, spatial light modulator 410 (FIG. 4) may be included in embodiments referencing FIG. 9. Unless otherwise noted, elements of FIG. 9 that have similar reference numbers as elements of FIGS. 4, 5A, 5B, 6, 7, and 8 may have similar structures and functions (e.g., reference numbers sharing the two right-most numeric digits).

In some embodiments, metrology system 900 comprises an illumination system 902, a detector 904, and a processor 906. Illumination system 902 may comprise a spatial light modulator 910. Illumination system 902 may generate a beam of radiation 942 to illuminate object 928. Object 928 may be a reticle 930 having a pellicle 932 disposed on a side of reticle 930. Reticle 930 may comprise pattern features 934.

In some embodiments, spatial light modulator 910 may direct beam of radiation 942 toward a surface of object 928 (e.g., surface of pellicle 932). Spatial light modulator 910 may adjust a spatial intensity distribution of beam of radiation 942 so as to illuminate a portion of the surface at a non-zero incidence angle. The non-zero incidence angle may be approximately 30-85 degrees, 45-85 degrees, 60-85 degrees, or greater than 80 degrees.

In some embodiments, detector 904 may receive radiation along an optical path 947 corresponding to radiation that has been scattered at the illuminated portion of the surface, represented as detected radiation 944. However, radiation that has been scattered by structures near the surface (represented as detected radiation 944') may travel along an optical path 947', which is different from optical path 947. Detector 904 may generate a detection signal based on the received radiation.

In some embodiments, processor 906 may receive the detection signal. Processor 906 may distinguish between a spurious signal and a signal corresponding to a presence of foreign particle 940 on surface based on the detection signal. The distinguishing may have an associated error probability, which may be based on a probability of detecting a spurious signal without being able to distinguish it from a presence of foreign particle 940. Therefore, the distinguishing may comprise reducing the probability of detecting a spurious signal based on a difference between optical paths 947 and 947'. A larger difference between optical paths 947 and 947' may result in more reduction of the probability of detecting the spurious signal.

Referring again to the concepts of spatial encoding and modulation of illumination at the pixel level, a sinusoidal modulation pattern was presented as an example of how two locations on the surface can be "encoded" with different illumination patterns that vary over time. However, the sinusoidal pattern was merely an example and other patterns may be used. For example, discrete and step patterns have been discussed in reference to some embodiments.

FIG. 10 shows a section of a metrology system 1000, according to some embodiments. It should be appreciated that any of the structures and functions described in reference to FIGS. 4, 5A, 5B, 6, 7, 8, and 9 may also be included in embodiments referencing FIG. 10. For example, in some embodiments, spatial light modulator 410 (FIG. 4) may be included in embodiments referencing FIG. 10. Unless otherwise noted, elements of FIG. 10 that have similar reference numbers as elements of FIGS. 4, 5A, 5B, 6, 7, and 8 may have similar structures and functions (e.g., reference numbers sharing the two right-most numeric digits).

Metrology system 1000 may be used for identifying and/or characterizing defects on an object 1028. Object 1028 may be, for example, a reticle 1030 having a protective pellicle 1032. A surface 1036 of pellicle 1032 may be at risk of developing a defect (e.g., a scratch or contaminant particle settling on it) over repeated usage. Surface 1038 of reticle 1030 (e.g., backside) may also be at risk of developing similar defects. Therefore, it should be appreciated that metrology system 1000 may be used to inspect surfaces 1036 and/or 1038 (or any surface in general of object 1028) by merely changing the orientation of object 1028.

For simplicity, certain elements of metrology system 1000 are not shown, such as elements that would be redundant with those shown in FIGS. 4, 5A, 5B, 6, 7, 8, and 9 (e.g., radiation source, detector, and the like). But it should be understood that, in some embodiments, such elements may be present as they were in FIGS. 4, 5A, 5B, 6, 7, 8, and 9. Using a spatial light modulator, a beam of radiation 1042 may be modulated according to patterns (e.g., first pattern, second pattern, additional patterns, and the like). Some examples of patterns have already been discussed above (e.g., periodic patterns in reference to FIGS. 5A and 5B).

In some embodiments, the patterns may be binary patterns (e.g., a series of on and off states of the illumination). Each location A, B, C, D, and the like, of surface 1036 of pellicle 1032, may be assigned a different binary pattern, similar to how different periodic patterns with frequencies $f_A$, $f_B$, and $f_C$ were used in reference to FIGS. 5A and 5B. For example, a spatial light modulator (e.g., 510 of FIG. 5A) may adjust the spatial intensity distribution of beam of radiation 1042 such that an illumination intensity of beam of radiation 1042 at location A of surface 1036 is modulated according to a first pattern 1042-A. Similarly, location B of surface 1036 may receive illumination modulated according to a second pattern 1042-B. Additional locations may receive illumination modulated according to corresponding additional patterns (e.g., up to an nth location of surface 1036 receiving illumination modulated according to an nth pattern 1042-$n$). The modulation patterns may be, e.g., binary patterns. Other patterns may also be apparent to those skilled in the art based on the present disclosure.

In some embodiments, detected radiation 1044 is radiation that is received at a downstream detector. Detected radiation 1044 is shown, as an example, to come from location D of surface 1036. Detected radiation 1044 may comprise mixed radiation, including radiation from a defect at location D (e.g., associated with a fourth pattern 1042-D) as well as other radiation that may be associated with a spurious signal(s). For example, radiation encoded with first pattern 1042-A may be incident at location A. With pellicle 1032 being at least semi-transparent, the radiation with first pattern 1042-A may partially transmit through pellicle 1032 and undergo multiple reflections between pellicle 1032 and reticle 1030 (as indicated by the arrows going from location A', to C, then to C'). Reticle 1030 may comprise pattern features 1034 that scatter radiation up toward location D. Such radiation can cause a spurious signal to be detected when detected radiation 1044 is received at a detector. Furthermore, radiation having a third pattern 1042-C may transmit through location C of surface 1036 and scatter from location C' in the direction of detected radiation 1044 due to interaction with pattern features 1034. The result is that detected radiation may include fourth pattern 1042-D (i.e., associated with a 'real' signal due to a defect) as well as first and third patterns 1042-A and 1042-C associated with spurious signals.

In some embodiments, the detection signal resulting from detected radiation 1044 may be analyzed by a processor (e.g., processor 506 of FIG. 5). Processor 506 may distinguish between a spurious signal and a signal corresponding to a presence of a defect on surface 1036 based on the detection signal. The analysis of the detection signal may be based on the modulating of beam of radiation 1042. If, for example, binary patterns are used in the modulating, the analysis may comprise a determination of a binary pattern(s) used at a given location(s) on surface 1036. Since the detection signal may correspond with a superposition of illumination having more than one binary pattern, the determination may include deconstructing the different modulation patterns at a given pixel(s). Having advanced knowledge of the spatial distribution of modulation patterns on surface 1036, the processor may associate or map pixels of a detector with the corresponding locations on surface 1036. The processor may distinguish spurious signals from 'real' signals. The distinguishing may comprise associating the spurious signal with a binary pattern uncharacteristic of the given location.

In some embodiments, there may be more distinct locations to be illuminated than there are available distinct modulation patterns. In this scenario, the modulation patterns may be reused and distributed across surface 1036 such that no two same binary patterns are used on adjacent locations on the surface. For example, FIG. 10 shows a sequence of distinct binary patterns 1042-A to 1042-n from left to right. When all distinct modulation patterns have been used at least once, the sequence may begin anew at 1042-A, which corresponds to location A2. The locations beyond the nth location may be referred to as further additional locations. More or fewer distinct modulation patterns may be used. In this manner, discrimination of locations and spurious signals may be enhanced.

The patterns used for modulating the different 'pixels' of beam of radiation 1042 may be further optimized to increase speed of measurement and information processing. In some embodiments, a set of linearly independent patterns as shown in Table 1 may be used as the first to nth patterns. Table 1 is a set of n=7 linearly independent patterns. A zero indicates an off state of illumination and a one indicates an on state of illumination.

TABLE 1

| Pattern Designation | Binary Pattern |
| --- | --- |
| 1042-A | 01100101 |
| 1042-B | 10101001 |
| 1042-C | 01011001 |

TABLE 1-continued

| Pattern Designation | Binary Pattern |
| --- | --- |
| 1042-D | 01101010 |
| 1042-E | 11110000 |
| 1042-F | 11000011 |
| 1042-G | 11001100 |

The contrast with FIG. 10 (where eight distinct patterns were used) is merely to show the selectability and non-limiting nature of formulating distinguishable modulation patterns. In some embodiments, each of the seven linearly independent binary patterns of Table 1 may be constructed using a sequence of eight on-or-off states. In any one pattern, the number of on states may be equal to the number of off states. In the example of Table 1, this would mean that each pattern has four on states and four off states, for a total of eight on-or-off states. If a larger set of linearly independent patterns is desired (e.g., n>7), more on-or-off states may be used (e.g., 10 on-or-off states). The number of linearly independent patterns may be increased, for example, in situations where it is desirable to further separate the physical distance between locations of reused patterns. For example, in FIG. 10, locations A and A2 are separated by seven patterns in between. If locations A and A2 were not so separated, then there is a possibility that stray illumination from location A' may be detected as though coming from location A2. In such a scenario, the processor may mistakenly interpret the spurious signal as a 'real' signal since first pattern 1042-A is also expected from location A2. It should be appreciated that linearly independent patterns are not limited to binary patterns (e.g., sinusoidal patterns associated with a Fourier transform may be linearly independent). It should be appreciated that the prefixes "first," "second," "third," and the like are arbitrary labels and should not be construed as limiting any pattern to a particular sequence disclosed herein. Using Table 1 as a non-limiting reference, any one of the code words in Table 1 may be a "first pattern." Of the remaining code words, any one of those may be a "second pattern."

In some embodiments, the set of binary patterns may be orthogonal. Similar to the Fourier analysis above (which involves an orthogonality relation of sinusoidal terms), having orthogonal binary patterns simplifies the amount of processing required to deconstruct superimposed patterns. Consequently, the speed of a measurement may be increased.

In some embodiments, table 1 may be referred to as a "code matrix," with C denoting the entire matrix and $c_i$ being a "code word" corresponding to row index i (i=A . . . G). For example, $c_B$=10101001 is a code word from matrix C. These code words may be described using orthogonality relations. One example of orthogonality may be described in terms of Eq. 1, which is akin to an inner product:

$$v \cdot u = \Sigma_j (v_j - \bar{c})(u_j - \bar{c}).$$ Eq. 1.

Here, v and u may be any two code words from the matrix C and the index j represents the jth on-or-off state. The code matrix C may be constructed such that each code words has the same mean value $\bar{c}$. In the example provided as Table 1, the mean is $\bar{c}$=0.5. Eq. 1 works out to zero for any non-equal pair of code words. The processor may use this property to greatly speed up calculations for determining whether a detected signal includes 'real' and/or spurious signals.

In some embodiments, further building on the orthogonality features, it is possible to construct a vector q that a processor can use for discriminating 'real' and spurious signals, with vector q being given by Eq. 2:

$$q=(C-\bar{c})(p-\bar{p}).$$  Eq. 2.

Here, C is the code word matrix and p is a vector representing the sequence of intensities detected at a given pixel of a detector. Each of the elements in vector p may be a numeric value that represents intensity (e.g., zero being no intensity detected). Regarding the mean vector p, each of its elements is populated with the mean of the intensity values found in vector p. The result of the matrix product is the vector q having seven elements (one for each linearly independent code word in the matrix C). A vector q may be generated for each pixel of the detector. Each value of the vector q is effectively the result of a scalar product between a code word (e.g., a modulation pattern in the form of a vector) and the vector p (e.g., a vector based on a detection signal).

In some embodiments, if there is scattering only from a defect at location B (illuminated by second pattern 1042-B), then the corresponding vector q may have the form q=(0,0, b, 0,0,0,0), where b is a positive value proportional to the intensity detected. If there is scattering only from location A' (illuminated by first pattern 1042-A), then q may have the form q=(a, 0,0,0,0,0,0), where a is a positive value proportional to the intensity due to radiation from location A'. If there is no scattering anywhere, then $q_B$ is all zeros. If there is scattering from both locations B and A', then q=(a, 0, b, 0,0,0,0). In this manner, by leveraging the results of vectors q, a processor may quickly determine which signals are present from which location on surface 1036 as well as discriminating between 'real' signals and spurious signals.

In some embodiments, the processor performing the analysis may isolate pixels of a detector, code words to consider, and/or exposure frame (e.g., particular element of the code word) in order to reduce calculations for increasing speed of measurement. Using q=(a, 0, b, 0,0,0,0) as an example, if the pixel associated with location B on surface 1036 is of interest, then processor need not perform the entire matrix multiplication of Eq. 2. Rather, the processor can simply compute the vector product $(c_B-\bar{c})$ $(p-\bar{p})$ to arrive at b without having to calculate the other elements of vector q.

In some embodiments, code words may also involve values other than full-on and full-off states, for example, selected from 0, 0.5, and 1. In this instance, each code word has a mean value of 0.5, which may be desirable for maintaining applicability of Eqs. 1 and 2. Taking this concept further, the code sequence can be generalized to include a spectrum of values. For example, raised cosine functions can be used, as given by Eq. 2:

$$c_{nm} = 1 + \cos\left(\frac{2\pi nm}{M}\right).$$  Eq. 3.

Here, $c_{nm}$ represents a single element corresponding to an nth row and mth column of the code matrix and M is the code word length. This is another non-limiting example of how one may construct code words and matrices. It should be appreciated that the concept of binary patterns (0s and 1s) has been generalized such that periodic patterns (e.g., cosine functions) may be used in conjunction with an analysis that is similar or analogous to the analysis described above with respect to binary patterns. Therefore, in some embodiments, the term "code word" is not constrained to only binary patterns. The term "code word" may be used to refer to a modulation pattern in general (e.g., a first pattern, second pattern, or the like).

In some embodiments, Eq. 3 yields values in between 0 and 2, inclusive. The value 2 may correspond to a particular intensity of illumination (e.g., maximum). The corresponding mean of each code word generated by Eq. 3 would then be $\bar{c}=1$. In some embodiments, an average of illumination intensities associated with a first pattern may be equal to an average of illumination intensities associated with a second pattern. In some embodiments, averages of illumination intensities corresponding to additional patterns may be equal to the average of illumination intensities of the first and/or second patterns.

As another example of constructing linearly independent patterns, in some embodiments, such a set may be constructed based on Table 2, which is based on a concept similar to Eq. 3, but selecting from a set of raised sines, raised cosines, and DC patterns.

TABLE 1

| Code Word Element | Value |
| --- | --- |
| $C_{1,m}$ | ½ |
| $C_{2,m}$ | $\frac{1}{2} + \frac{1}{2}\cos\left(\frac{2\pi m}{M}\right)$ |
| $C_{3,m}$ | $\frac{1}{2} + \frac{1}{2}\sin\left(\frac{2\pi m}{M}\right)$ |
| $C_{4,m}$ | $\frac{1}{2} + \frac{1}{2}\cos\left(\frac{4\pi m}{M}\right)$ |
| $C_{5,m}$ | $\frac{1}{2} + \frac{1}{2}\sin\left(\frac{4\pi m}{M}\right)$ |
| ... | ... |
| $C_{M,m}$ | $\frac{1}{2} + \frac{1}{2}\cos\left(\frac{M\pi m}{M}\right)$ |

The index m goes from 1 to M, where M is the length of the code word or number of columns in the code word matrix. Table 2 then generates an M×M matrix. Code word $C_1$ is a DC signal. The other code words are raised sines and cosines with an integer number of periods. It should be appreciated that permutations of rows and/or columns may also be used. Furthermore, fewer code words (e.g., a subset of rows) may also be suitable, which would result in a code matrix of size N×M, with N<M.

In some embodiments, comparing the raised sines/cosines of Table 2 to Eq. 3, it can be seen that the values of Table 2 have been normalized by a factor of ½ compared to Eq. 3. The factor may be chosen based on constraints of metrology system 1000. For example, a factor may be chosen to be different per code word, causing the mean value $\bar{c}$ to be different between code words. The difference may lead to cross talk between pixels (e.g., the modulation at a first pixel may affect detection results at a second pixel simply based on sub-optimal construction of code words, whether or not radiation is detected at second one pixel), for example, when using Eq. 2. Similarly, the use of integer number of periods for raised sines/cosines allows for construction of a code word matrix with constant mean value throughout. However, it should be appreciated that a constant mean value c for a code word matrix is not strictly required for achieving desired results (e.g., spurious signal discrimination and defect detection).

In some embodiments, an orthogonality relation similar to Eq. 1 may be implemented for code words generated by Eq. 3 and/or Table 2, for example, as shown in Eq. 4:

$$\Sigma_j (C_{ij}-\bar{c})(C_{kj}-\bar{c})=0; \text{ for } i \neq k \qquad \text{Eq. 4}$$

Here, $C_{ij}$ represents an element associated with the ith row of a code word matrix and $C_{kj}$ represents an element associated with the kth row of the code word matrix. The sum index j represents the column of the code word matrix. Much like Eq. 1, the result is zero if unequal code words are selected for the computation.

In some embodiments, linearly independent code words that are not orthogonal may be used, as long as there are no negative values in the code words (e.g., the lowest possible intensity of illumination is 0). In this scenario, Eq. 2 can be generalized to take the form of Eq. 5:

$$q = (C^T)^+ p \qquad \text{Eq. 5}$$

Here, the superscript T indicates the transpose and the superscript+indicates the pseudoinverse. The vectors q and p are as previously described. For performing analysis using a processor, in some embodiments, a particular element of the vector q may be calculated by multiplying the vector p to the corresponding row of $(C^T)^+$. The cross talk issue discussed above may be mitigated using the generalized form that is Eq. 5.

In some embodiments, using the same number of exposures, different code matrices can be applied simultaneously in different wavelengths. For example, a typical DMD device is already capable of performing a complex exposure using red, green, and blue wavelengths. This can be further modified to include other wavelengths and wavelength combinations. For example, an intensity state of a pattern may be associated with a first wavelength and a second intensity state of the pattern may be associated with a second wavelength different from the first wavelength. In another example, an intensity state of a first pattern may be associated with a first wavelength and an intensity state of a second pattern may be associated with a second wavelength different from the first wavelength. In a further example, using three 7×8 matrices, it is possible to obtain $7^3=343$ unique code words. Furthermore, modulation patterns in general may employ multiple wavelengths.

It should be understood that, in some embodiments, a perfectly monochromatic wavelength may not be feasible or practical to produce (e.g., hardware limitations). Therefore, it should be appreciated that the term "first wavelength" may refer to a narrow band that is approximately centered about a wavelength. The second wavelength can be similarly described. In this scenario, two wavelengths being different may refer to the respective two center wavelengths being different.

In some embodiments, the wavelengths defined as being "different" may be a function of metrology system 1000. For example, a first wavelength (having a band and a central wavelength) and second wavelength (having a band and a different central wavelength) may be considered as different if metrology system 1000 is able to resolve the difference. Conversely, two wavelength bands may not be different in the sense that they overlap enough to the extent that metrology system 1000 is unable to resolve a difference.

Although specific embodiments have been described in the context of detecting foreign particles (e.g., defect 440 (FIG. 4), the embodiments described herein are not limited to particulate contamination detection. In some embodiments, the metrology systems described herein may detect imperfections in general such as scratches, holes, or recesses, foreign particles, stains, and the like. It is desirable to detect all types of imperfections that pose a risk of disrupting lithographic processes.

In some embodiments, metrology systems described herein may be implemented in a larger system, for example, within a lithographic apparatus.

The embodiments may further be described using the following clauses:

1. A system comprising:
   an illumination system comprising:
   a radiation source configured to generate a beam of radiation;
   a spatial light modulator configured to direct the beam toward a surface of an object and to adjust a spatial intensity distribution of the beam at the surface;
   a detector configured to receive radiation scattered at the surface and by a structure near the surface and to generate a detection signal based on the received radiation; and
   a comparator configured to:
   analyze the detection signal;
   determine a location of a defect on the surface based on the analyzing; and
   distinguish between a spurious signal and a signal corresponding to the defect based on the analyzing and adjusting.

2. The system of clause 1, wherein:
   the spatial light modulator is further configured to adjust the spatial intensity distribution such that an illumination intensity of the beam at a first location on the surface is modulated according to a first pattern and an illumination intensity of the beam at a second location on the surface is modulated according to a second pattern different from the first pattern;
   the second location is different from the first location; and
   the analyzing comprises an analysis of the detection signal based on the modulating.

3. The system of clause 2, wherein:
   the first and second patterns correspond to first and second binary patterns; and
   the analysis comprises a determination of a binary pattern used at a given location on the surface.

4. The system of clause 3, wherein the distinguishing comprises associating the spurious signal with a binary pattern uncharacteristic of the given location.

5. The system of clause 3, wherein each of the first and second binary patterns comprises a number of off states that is equal to the number of on states.

6. The system of clause 2, wherein a first intensity state of the first pattern is associated with a first wavelength and a second intensity state of the first pattern is associated with a second wavelength different from the first wavelength.

7. The system of clause 2, wherein an intensity state of the first pattern is associated with a first wavelength and an intensity state of the second pattern is associated with a second wavelength different from the first wavelength.

8. The system of clause 2, wherein:
   the spatial light modulator is further configured to adjust the spatial intensity distribution such that an illumination intensity of the beam at additional locations on the surface are modulated according to corresponding additional patterns;
   the first, second, and each of the additional patterns are different from each other;
   the distinguishing comprises associating the spurious signal with a pattern uncharacteristic of the given location.

9. The system of clause 8, wherein the first, second, and additional patterns are reused at further additional locations on the surface; and
the reused first, second, and additional patterns are distributed on the surface such that no two same patterns are used on adjacent locations on the surface.

10. The system of clause 2, wherein the first pattern is linearly independent from the second pattern.

11. The system of clause 2, wherein the first pattern is orthogonal to the second pattern.

12. The system of clause 2, wherein:
the first and second patterns correspond to first and second periodic patterns;
a frequency and/or phase of the first periodic pattern is different from a frequency and/or phase of the second periodic pattern; and
the analysis comprises a frequency analysis.

13. The system of clause 12, wherein:
the frequency analysis comprises a determination of a frequency and/or phase of illumination modulation used at a given location on the surface; and
the distinguishing comprises associating the spurious signal with a frequency and/or phase uncharacteristic of the given location.

14. The system of clause 12, wherein:
a sequence of intensity states of the first periodic pattern comprises a variation relative to an orderly original sequence of the first periodic pattern; and/or
a sequence of intensity states of the second periodic pattern comprises a variation relative to an orderly original sequence of the second periodic pattern.

15. The system of clause 12, wherein the first and/or second patterns are based on raised sine and/or cosine functions.

16. The system of clause 2, wherein the analysis comprises a scalar product of the first pattern and a vector based on the detection signal.

17. The system of clause 12, wherein the frequency analysis comprises a Fourier analysis.

18. The system of clause 17, wherein the Fourier analysis comprises:
a Fourier transform of the detection signal; and
a Fourier reconstruction of a waveform used to modulate illumination at a given location based on an omission of at least a modulation parameter uncharacteristic of the given location.

19. The system of clause 1, wherein:
the spatial intensity distribution comprises a sequence of first, second, and third states of a periodic spatial intensity distribution based on the adjusting;
the second state is different from the first and third states; and
the detection signal comprises a modulation based on the first, second and third states;
the analyzing comprises an analysis of the modulation to determine at least a location on the surface exhibiting a diminished optical response to the adjusting.

20. The system of clause 19, wherein the distinguishing comprises associating the spurious signal with the location on the surface exhibiting the diminished optical response to the adjusting.

21. The system of clause 19, wherein:
the radiation scattered by the structure near the surface is generated from a transmitted portion of the beam through the surface; and
the transmitted portion comprises the periodic spatial intensity distribution with a diminished contrast.

22. The system of clause 1, wherein:
the radiation source is further configured to adjust a wavelength of the beam;
the beam comprises first and second different wavelengths;
the detection signal comprises wavelength information of the received radiation based on the first and second different wavelengths; and
the analyzing comprises an analysis of the wavelength information to determine at least a location on the surface exhibiting a difference in optical response to the adjusting the wavelength.

23. The system of clause 22, wherein the distinguishing comprises associating the spurious signal with the location on the surface exhibiting the difference in optical response to the adjusting the wavelength.

24. The system of clause 22, wherein the difference in optical response to the adjusting the wavelength comprises a difference between an attenuation of the received radiation based on the first wavelength and an attenuation of the received radiation based on the second wavelength.

25. The system of clause 1, wherein:
the illumination system is configured to adjust a polarization of the beam and further comprises a polarizer configured to modify the polarization of the beam;
the beam comprises first and second different polarizations;
the detection signal comprises polarization information of the received radiation based on the first and second different polarizations; and
the analyzing comprises an analysis of the polarization information to determine at least a location on the surface exhibiting a difference in optical response to the adjusting the polarization.

26. The system of clause 25, wherein the distinguishing comprises associating the spurious signal with the location on the surface exhibiting the difference in optical response to the adjusting the polarization.

27. The system of clause 25, wherein the difference in optical response to the adjusting the polarization comprises a difference between an intensity of the received radiation based on the first polarization and an intensity of the received radiation based on the second polarization.

28. The system of clause 1, wherein:
the spatial light modulator is further configured to adjust the spatial intensity distribution so as to illuminate a portion of the surface at a non-zero incidence angle;
the detector is further configured to receive radiation along an optical path of radiation scattered at the portion of the surface; and
the system is configured to reduce a probability of a spurious signal event based on a difference between the optical path and an optical path corresponding to radiation scattered by the structure near the surface.

29. The system of clause 1, wherein the spatial light modulator comprises a digital micromirror device.

30. The system of clause 1, wherein the spatial light modulator comprises a liquid crystal modulator.

31. The system of clause 1, wherein the detector comprises a charge-coupled device or a complementary metal-oxide-semiconductor.

32. The system of clause 1, wherein:
the spatial light modulator is further configured to temporally adjust the spatial intensity distribution such that an illumination intensity of the beam at a first location on the surface is modulated at a first frequency and an illumination intensity of the beam at a second location on the surface is modulated at a second frequency;

the second location is different from the first location;

the second frequency is different from the first frequency; and the system is configured to enhance an optical resolution of detection based on a frequency analysis of the detection signal.

33. A method comprising:

generating a beam of radiation;

directing the beam toward a surface of an object;

adjusting a spatial intensity distribution of the beam using a spatial light modulator;

receiving scattered radiation at a detector, wherein the scattered radiation comprises radiation scattered at the surface and radiation scattered by a structure near the surface;

generating a detection signal using the detector;

analyzing the detection signal using a processor;

determining a location of a defect on the surface based on the analyzing; and distinguishing between a spurious signal and a signal corresponding to the defect based on the analyzing and the adjusting using the processor.

34. The method of clause 33, wherein:

the adjusting comprises adjusting the spatial intensity distribution using the spatial light modulator such that an illumination intensity of the beam at a first location on the surface is modulated according to a first pattern and an illumination intensity of the beam at a second location on the surface is modulated according to a second pattern;

the second location is different from the first location; and the analyzing comprises analyzing the detection signal based on the modulating.

35. The method of clause 33, wherein:

the spatial intensity distribution comprises a sequence of first, second, and third states of a periodic spatial intensity distribution based on the adjusting;

the second state is different from the first and third states;

the detection signal comprises modulation based on the first, second and third states; and the analyzing comprises analyzing the modulation to determine at least a location on the surface exhibiting a diminished optical response to the adjusting.

36. The method of clause 33, further comprising:

the method further comprises adjusting the wavelength of the beam;

the beam comprises first and second different wavelengths;

the detection signal comprises wavelength information of the received radiation based on the first and second different wavelengths; and the analyzing comprises analyzing the wavelength information to determine at least a location on the surface exhibiting a difference in optical response to the adjusting the wavelength.

37. The method of clause 33, wherein:

the method further comprises adjusting a polarization of the beam;

the beam comprises first and second different polarizations;

the detection signal comprises polarization information of the received radiation based on the first and second different polarizations; and the analyzing comprises analyzing the polarization information to determine at least a location on the surface exhibiting a difference in optical response to the adjusting the polarization.

38. The method of clause 33, wherein:

the adjusting comprises adjusting the spatial intensity distribution to illuminate a portion of the surface at a non-zero incidence angle, wherein:

the receiving comprises receiving radiation along an optical path of radiation scattered at the portion of the surface, and the method further comprises reducing a probability of a spurious signal event based on a difference between the optical path and an optical path of the radiation scattered by a structure near the surface.

39. The method of clause 33, wherein:

the adjusting comprises temporally adjusting the spatial intensity distribution using the spatial light modulator such that an illumination intensity of the beam at a first location on the surface is modulated at a first frequency and an illumination intensity of the beam at a second location on the surface is modulated at a second frequency;

the second location is different from the first location;

the second frequency is different from the first frequency; and the method comprises enhancing an optical resolution of detection based on a frequency analysis of the detection signal.

40. A lithographic apparatus comprising:

an illumination apparatus configured to illuminate a pattern of a patterning device;

a projection system configured to project an image of the pattern onto a substrate; and a metrology system comprising:

an illumination system comprising:

a radiation source configured to generate a beam of radiation;

a spatial light modulator configured to direct the beam toward a surface of an object and to adjust a spatial intensity distribution of the beam at the surface;

a detector configured to receive radiation scattered at the surface and by a structure near the surface and to generate a detection signal based on the received radiation; and a processor configured to:

analyze the detection signal;

determine a location of a defect on the surface based on the analyzing; and distinguish between a spurious signal and a signal corresponding to the defect based on the analyzing and adjusting.

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track unit (a tool that typically applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

Although specific reference may have been made above to the use of embodiments of the present disclosure in the context of optical lithography, it will be appreciated that the present disclosure can be used in other applications, for example imprint lithography, and where the context allows, is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present disclosure is to be interpreted by those skilled in relevant art(s) in light of the teachings herein.

The term "substrate" as used herein describes a material onto which material layers are added. In some embodiments, the substrate itself can be patterned and materials added on top of it may also be patterned, or may remain without patterning.

Although specific reference can be made in this text to the use of the apparatus and/or system according to the present disclosure in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the present disclosure have been described above, it will be appreciated that the present disclosure can be practiced otherwise than as described. The description is not intended to limit the present disclosure.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein.

The breadth and scope of protected subject matter should not be limited by any of the above-described exemplary embodiments, but should be defined only in accordance with the following claims and their equivalents.

The invention claimed is:

1. A system comprising:
an illumination system comprising:
a radiation source configured to generate a beam of radiation;
a spatial light modulator configured to direct the beam toward a surface of an object and to adjust a spatial intensity distribution of the beam at the surface;
a detector configured to receive radiation scattered at the surface and by a structure near the surface and to generate a detection signal based on the received radiation; and
a comparator configured to:
analyze the detection signal;
determine a location of a defect on the surface based on the analyzing; and
distinguish between a spurious signal and a signal corresponding to the defect based on the analyzing and adjusting.

2. The system of claim 1, wherein:
the spatial light modulator is further configured to adjust the spatial intensity distribution such that an illumination intensity of the beam at a first location on the surface is modulated according to a first pattern and an illumination intensity of the beam at a second location on the surface is modulated according to a second pattern different from the first pattern;
the second location is different from the first location; and
the analyzing comprises an analysis of the detection signal based on the modulating.

3. The system of claim 2, wherein a first intensity state of the first pattern is associated with a first wavelength and a second intensity state of the first pattern is associated with a second wavelength different from the first wavelength.

4. The system of claim 2, wherein an intensity state of the first pattern is associated with a first wavelength and an intensity state of the second pattern is associated with a second wavelength different from the first wavelength.

5. The system of claim 2, wherein:
the spatial light modulator is further configured to adjust the spatial intensity distribution such that an illumination intensity of the beam at additional locations on the surface are modulated according to corresponding additional patterns;
the first, second, and each of the additional patterns are different from each other;
the distinguishing comprises associating the spurious signal with a pattern uncharacteristic of the given location.

6. The system of claim 2, wherein:
the first and second patterns correspond to first and second periodic patterns;
a frequency and/or phase of the first periodic pattern is different from a frequency and/or phase of the second periodic pattern; and
the analysis comprises a frequency analysis.

7. The system of claim 6, wherein:
the frequency analysis comprises a determination of a frequency and/or phase of illumination modulation used at a given location on the surface; and the distinguishing comprises associating the spurious signal with a frequency and/or phase uncharacteristic of the given location.

8. The system of claim 6, wherein:
a sequence of intensity states of the first periodic pattern comprises a variation relative to an orderly original sequence of the first periodic pattern; and/or
a sequence of intensity states of the second periodic pattern comprises a variation relative to an orderly original sequence of the second periodic pattern.

9. The system of claim 1, wherein:
the spatial intensity distribution comprises a sequence of first, second, and third states of a periodic spatial intensity distribution based on the adjusting;
the second state is different from the first and third states;
the detection signal comprises a modulation based on the first, second and third states; and
the analyzing comprises an analysis of the modulation to determine at least a location on the surface exhibiting a diminished optical response to the adjusting.

10. The system of claim 9, wherein the distinguishing comprises associating the spurious signal with the location on the surface exhibiting the diminished optical response to the adjusting.

11. The system of claim 9, wherein:
the radiation scattered by the structure near the surface is generated from a transmitted portion of the beam through the surface; and
the transmitted portion comprises the periodic spatial intensity distribution with a diminished contrast.

12. The system of claim 1, wherein:
the radiation source is further configured to adjust a wavelength of the beam;
the beam comprises first and second wavelengths that are different;
the detection signal comprises wavelength information of the received radiation based on the first and second wavelengths; and
the analyzing comprises an analysis of the wavelength information to determine at least a location on the surface exhibiting a difference in optical response to the adjusting the wavelength.

13. The system of claim 12, wherein the distinguishing comprises associating the spurious signal with the location on the surface exhibiting the difference in optical response to the adjusting the wavelength.

14. The system of claim 12, wherein the difference in optical response to the adjusting the wavelength comprises a difference between an attenuation of the received radiation based on the first wavelength and an attenuation of the received radiation based on the second wavelength.

15. The system of claim 1, wherein:
the illumination system is configured to adjust a polarization of the beam and further comprises a polarizer configured to modify the polarization of the beam;
the beam comprises first and second polarizations that are different;
the detection signal comprises polarization information of the received radiation based on the first and second polarizations; and the analyzing comprises an analysis of the polarization information to determine at least a location on the surface exhibiting a difference in optical response to the adjusting the polarization.

16. The system of claim 15, wherein the distinguishing comprises associating the spurious signal with the location on the surface exhibiting the difference in optical response to the adjusting the polarization.

17. The system of claim 15, wherein the difference in optical response to the adjusting the polarization comprises a difference between an intensity of the received radiation based on the first polarization and an intensity of the received radiation based on the second polarization.

18. The system of claim 1, wherein:
the spatial light modulator is further configured to adjust the spatial intensity distribution so as to illuminate a portion of the surface at a non-zero incidence angle;
the detector is further configured to receive radiation along an optical path of radiation scattered at the portion of the surface; and
the system is configured to reduce a probability of a spurious signal event based on a difference between the optical path and an optical path corresponding to radiation scattered by the structure near the surface.

19. The system of claim 1, wherein:
the spatial light modulator is further configured to temporally adjust the spatial intensity distribution such that an illumination intensity of the beam at a first location on the surface is modulated at a first frequency and an illumination intensity of the beam at a second location on the surface is modulated at a second frequency;
the second location is different from the first location;
the second frequency is different from the first frequency; and
the system is configured to enhance an optical resolution of detection based on a frequency analysis of the detection signal.

20. A lithographic apparatus comprising:
an illumination apparatus configured to illuminate a pattern of a patterning device;
a projection system configured to project an image of the pattern onto a substrate; and
a metrology system comprising:
an illumination system comprising:
a radiation source configured to generate a beam of radiation;
a spatial light modulator configured to direct the beam toward a surface of an object and to adjust a spatial intensity distribution of the beam at the surface;
a detector configured to receive radiation scattered at the surface and by a structure near the surface and to generate a detection signal based on the received radiation; and
a processor configured to:
analyze the detection signal;
determine a location of a defect on the surface based on the analyzing; and
distinguish between a spurious signal and a signal corresponding to the defect based on the analyzing and adjusting.

* * * * *

UNITED STATES PATENT AND TRADEMARK OFFICE
CERTIFICATE OF CORRECTION

PATENT NO. : 11,803,119 B2
APPLICATION NO. : 17/790339
DATED : October 31, 2023
INVENTOR(S) : Pawlowski et al.

It is certified that error appears in the above-identified patent and that said Letters Patent is hereby corrected as shown below:

In the Specification

In Column 28, Line 63, after "value", insert -- $\bar{c}$ --, therefor.

In Column 28, Line 64, delete "c" and insert -- $\bar{c}$ --, therefor.

Signed and Sealed this
Twenty-sixth Day of March, 2024

*Katherine Kelly Vidal*
*Director of the United States Patent and Trademark Office*